(12) United States Patent
Mira et al.

(10) Patent No.: US 11,632,853 B2
(45) Date of Patent: Apr. 18, 2023

(54) HEATSINK WITH PERPENDICULAR VAPOR CHAMBER

(71) Applicant: HEATSCAPE.COM, INC., Morgan Hill, CA (US)

(72) Inventors: Ali Mira, Morgan Hill, CA (US); Yashar Mira, Morgan Hill, CA (US); Michael Mira, Morgan Hill, CA (US)

(73) Assignee: Heatscape.com, Inc., Morgan Hill, CA (US)

( * ) Notice: Subject to any disclaimer, the term of this patent is extended or adjusted under 35 U.S.C. 154(b) by 93 days.

(21) Appl. No.: 17/202,068

(22) Filed: Mar. 15, 2021

(65) Prior Publication Data
US 2022/0295627 A1    Sep. 15, 2022

(51) Int. Cl.
| | | |
|---|---|---|
| *H05K 1/02* | (2006.01) | |
| *H01L 23/367* | (2006.01) | |
| *F28D 15/02* | (2006.01) | |
| *F28D 21/00* | (2006.01) | |

(52) U.S. Cl.
CPC ........... *H05K 1/0203* (2013.01); *F28D 15/02* (2013.01); *H01L 23/367* (2013.01); *F28D 2021/0029* (2013.01); *H05K 2201/066* (2013.01)

(58) Field of Classification Search
CPC ........... H05K 1/0203; H05K 2201/066; H05K 7/20336; H05K 7/20154; H05K 7/2039; H05K 7/20172; H05K 7/20145; H05K 7/20936; H01L 23/367; H01L 23/427; H01L 23/467; F28D 15/02; F28D 15/0233; F28D 15/0266; F28D 2021/0029
See application file for complete search history.

(56) References Cited

U.S. PATENT DOCUMENTS

| | | | |
|---|---|---|---|
| 6,714,413 B1* | 3/2004 | Ghosh | F28D 15/0266 361/698 |
| 6,867,974 B2* | 3/2005 | Luo | F28D 15/02 257/722 |
| 7,422,053 B2* | 9/2008 | Siu | F28F 3/02 165/104.33 |
| 2004/0070941 A1* | 4/2004 | Ghosh | F28D 15/0266 165/104.33 |
| 2005/0173098 A1* | 8/2005 | Connors | F28D 15/0233 165/104.21 |
| 2008/0170368 A1* | 7/2008 | Chen | F28D 15/0233 257/E23.088 |

(Continued)

*Primary Examiner* — Adam B Dravininkas
(74) *Attorney, Agent, or Firm* — Kilpatrick Townsend & Stockton LLP

(57) ABSTRACT

Heat dissipation systems may include a base, a vapor chamber, and a plurality of cooling fins. The base may contact a top surface of a chip on a printed circuit board to be cooled. The vapor chamber may be planar and be coupled to and extend from the base so that the planar vapor chamber is perpendicular relative to the top surface of the chip. The vapor chamber is coupled to the base so that a first portion of the vapor chamber extends along the base in a first direction, and a second portion of the vapor chamber, adjacent to the first portion of the vapor chamber, extends in the first direction past an edge of the base in order to overhang the printed circuit board. Both the first portion and the second portion of the vapor chamber include the plurality of cooling fins.

17 Claims, 16 Drawing Sheets

(56) References Cited

U.S. PATENT DOCUMENTS

| | | | |
|---|---|---|---|
| 2008/0236790 A1* | 10/2008 | Bhatti | H01L 23/427 |
| | | | 257/E23.099 |
| 2010/0018678 A1* | 1/2010 | Siu | F28D 15/046 |
| | | | 165/104.33 |
| 2011/0000649 A1* | 1/2011 | Joshi | H01L 23/467 |
| | | | 165/185 |
| 2012/0268877 A1* | 10/2012 | Rice | H05K 7/20 |
| | | | 165/104.21 |
| 2018/0192545 A1* | 7/2018 | Chen | H05K 7/20409 |
| 2018/0288902 A1* | 10/2018 | Wei | H05K 7/20336 |

\* cited by examiner

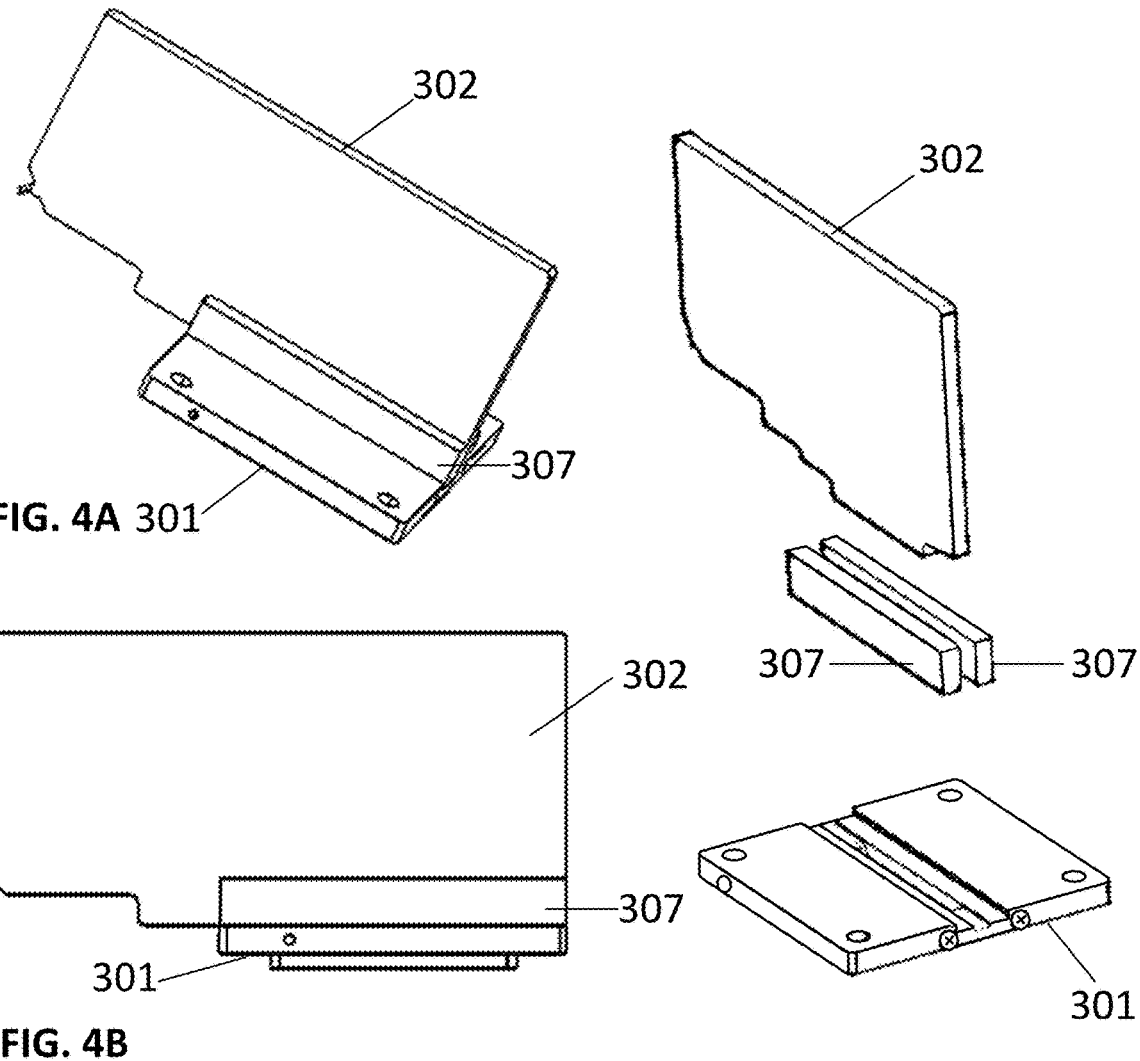

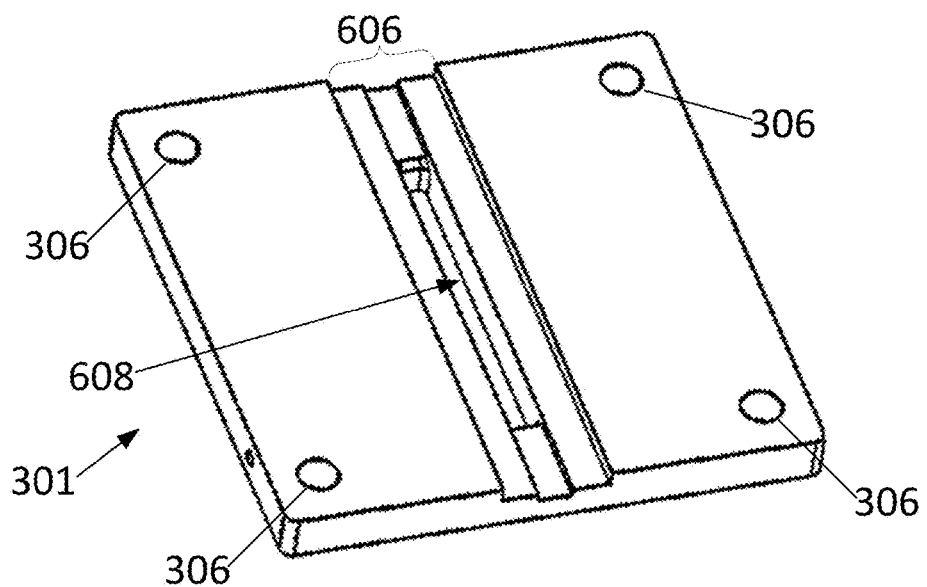
FIG. 6A
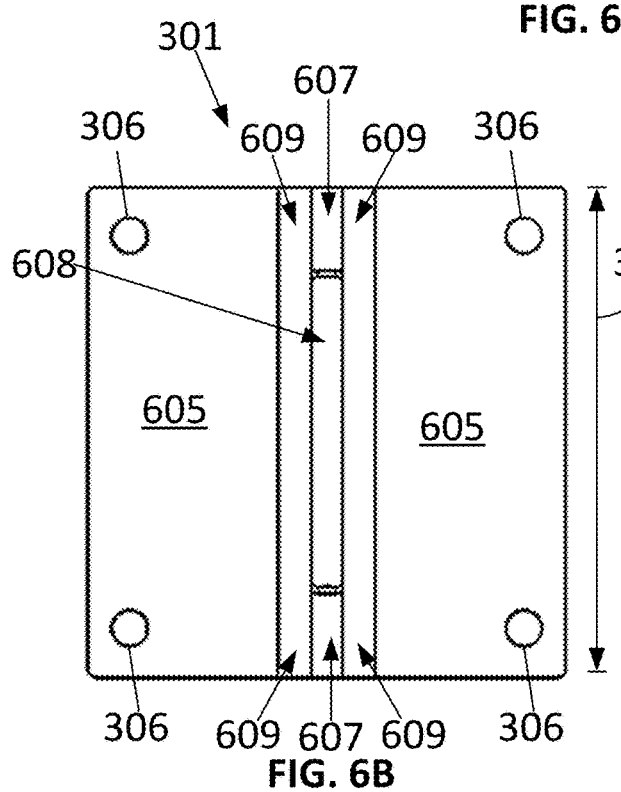
FIG. 6B
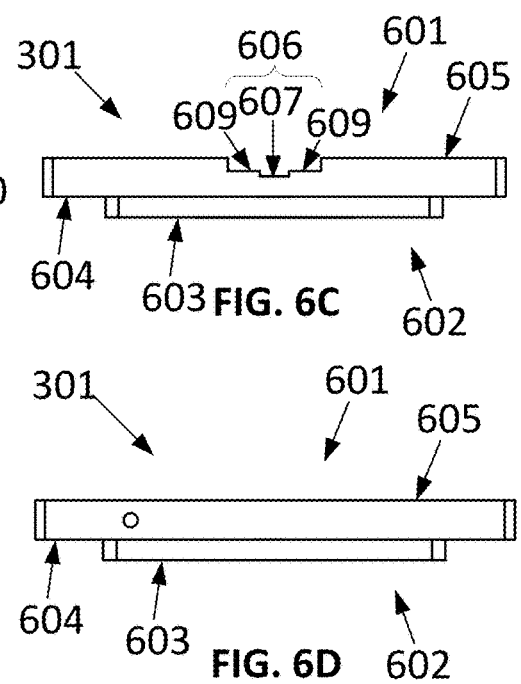
FIG. 6C
FIG. 6D

HEATSINK WITH PERPENDICULAR VAPOR CHAMBER

FIELD OF THE INVENTION

The present technology relates to heat dissipation systems, i.e. cooling systems, including vapor chambers used for cooling electrical components.

BACKGROUND

Chips (e.g., microchips or integrated circuits) generate heat when used. Central processing units (CPUs) and graphics processing units (GPUs) are two non-limiting examples of chips that can generate a tremendous amount of heat as a result of performing numerous extremely high-speed operations required for executing computer programs. In order to operate properly, the heat is dissipated in order to cool the chip, for example with a heatsink. The computer industry is continually innovating cooling systems to address the unique and demanding cooling requirements of chips that produce large amounts of heat.

A heatsink is used to transfer heat away from the chip and towards the cooling fins of the heatsink. The cooling fins provide a large surface area for transfer of the heat from the cooling fins to the surrounding environment through convection, conduction, and radiation. Some heatsinks include vapor chambers to transfer heat from the chip toward the cooling fins.

Heatsinks may be mounted directly on top of a chip on a printed circuit board, and extend directly away from the chip in a direction perpendicular to the chip and board. As chips become more powerful and generate more heat, the volume of heatsink needed may exceed the available space above the chip to be cooled. Accordingly, there is a need to increase the cooling capacity of a heatsink without increasing the distance heatsink extends above the chip.

BRIEF SUMMARY

The present technology relates to heat dissipation systems. The heat dissipation systems may include a base, a vapor chamber and cooling fin assemblies. The base may define a top surface and a flat bottom surface, opposite the top surface, configured for contacting a chip. The vapor chamber may be planar and include two planar side surfaces. The vapor chamber may be coupled to the base so that the two planar side surfaces are perpendicular to the flat bottom surface. Each cooling fin assembly may be respectively coupled to one of the two planar side surfaces of the vapor chamber. A first portion of the vapor chamber may be coupled to the base so that the first portion of the vapor chamber extends along the top surface of the base in a first direction. A second portion of the vapor chamber, adjacent to the first portion of the vapor chamber, may extend in the first direction past an edge of the base in order to define an overhanging portion. The two cooling fin assemblies may each be coupled to both the first and second portions of the vapor chamber so that portions of the two cooling fin assemblies further define the overhanging portion.

The first portion of the vapor chamber may extend a first distance in the first direction along the top surface of the base, and the second portion of the vapor chamber may extend a second distance in the first direction past the edge of the base. The second distance may be at least 20% of the first distance, and may be at least 50% of the first distance.

The vapor chamber may define a top edge, two side edges and a bottom edge. The bottom may comprise a stepped profile defining a plurality of different heights of the vapor chamber in a second direction perpendicular to the first direction and parallel to the two planar side surfaces of the vapor chamber. In the first portion of the vapor chamber, the stepped profile may define a first height of the plurality of different heights, and in the second portion of the vapor chamber the stepped profile may define a second height plurality of different heights, less than the first height. The base may define a slot, the stepped profile may define a first tab of the vapor chamber, and the first tab of the vapor chamber may be coupled within the slot of the base. The stepped profile may further define a second tab in the first portion of the vapor chamber and an overhanging edge in the second portion of the vapor chamber. The second tab may extend further from the top edge of the vapor chamber than the overhanging edge. The first tab may extend from the second tab and extend further from the top edge of the vapor chamber than the second tab. The second tab may contact the base on opposite sides of the slot.

Heat dissipation systems may further include a first mounting block coupled to the base, extending in the first direction, and contacting a first planar side surface of the two planar side surfaces of the vapor chamber; and a second mounting block coupled to the base, extending in the first direction, and contacting a second planar side surface of the two planar side surfaces of the vapor chamber.

Heat dissipation systems may further include a first fan coupled to the two cooling fin assemblies and positioned over the first portion of the vapor chamber; and a second fan coupled to the two cooling fin assemblies and positioned over the second portion of the vapor chamber.

Heat dissipation systems may further include a printed circuit board comprising the chip. The base may be coupled to the board with the flat bottom surface contacting a top surface of the chip, and the overhanging portion may be positioned over a portion of the printed circuit board not occupied by the chip. The two cooling fin assemblies may include a plurality of stacked planar fins extending perpendicularly to the two planar side surfaces of the vapor chamber and the flat bottom surface of the base. A first portion of the plurality of stacked planar fins coupled to the first portion of the vapor chamber may define a third height in the second direction, and a second portion of the plurality of stacked planar fins coupled to the second portion of the vapor chamber may define a fourth height in the second direction, less than the third height.

Heat dissipation systems may be assembled by coupling the vapor chamber to the base so that the two planar side surfaces of the vapor chamber are perpendicular to the flat bottom surface of the base; and coupling the two cooling fin assemblies to the two planar side surfaces of the vapor chamber. Coupling the vapor chamber to the base may comprise coupling a first portion of the vapor chamber to the base so that the first portion of the vapor chamber extends along the top surface of the base in a first direction. With the first portion coupled to the base, a second portion of the vapor chamber, adjacent to the first portion of the vapor chamber, may extend in the first direction past an edge of the base in order to define an overhanging portion. The two cooling fin assemblies may each be coupled to both the first and second portions of the vapor chamber so that portions of the two cooling fin assemblies further define the overhanging portion. The first portion of the vapor chamber may extend a first distance in the first direction along the top surface of the base, and the second portion of the vapor chamber may extend a second distance in the first direction past the edge of the base.

This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to the entire specification of this patent, all drawings and each claim.

BRIEF DESCRIPTION OF THE DRAWINGS

The features of the various embodiments described above, as well as other features and advantages of certain embodiments of the present technology will be more apparent from the following detailed description taken in conjunction with the accompanying drawings, in which:

FIGS. 4A-4C show views of a vapor chamber and base assembly according to embodiments of the present technology.

FIGS. 6A-6D show views of a base according to embodiments of the present technology.

In accordance with common practice, the described features and elements are not drawn to scale but are drawn to emphasize features and elements relevant to the present disclosure.

DETAILED DESCRIPTION

Aspects of the present disclosure relate generally to systems and methods of assembly relating to heatsink assemblies including vapor chambers extending in a direction perpendicular to a plane of the board and the chip to which the heatsink assembly is attached.

In the following description, various examples of heatsink assemblies and methods for assembling and installing the heatsink assembly are described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

In the following description, directional phrases may be used to describe positions and orientations of components of the embodiments of the present technology. The directional phrases may be used for purposes of explanation to describe relative positions of two or more different components, and are not limiting in the positions and orientations that embodiments of the present technology may be placed. For example, a surface may be referred to as a top surface of a component of a device with reference to the figures, wherein the top surface faces upwards in the figures. However, the device may be oriented in a different orientation than shown in the figures so that the top surface may face any other direction, for example sideways or down.

Figure 1A:
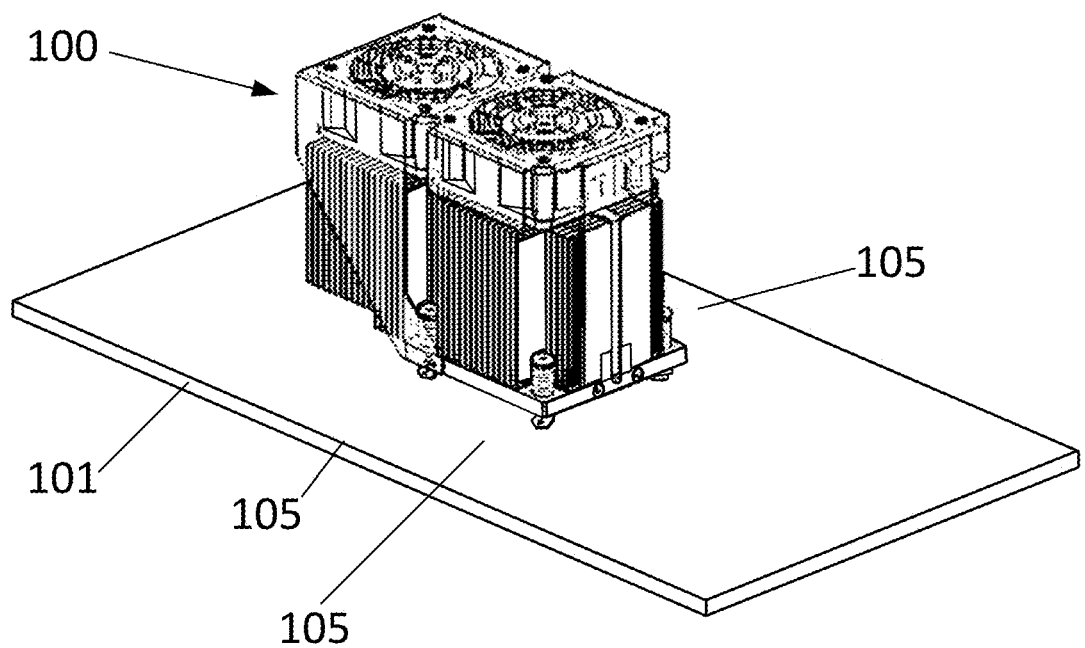
FIGS. 1A-D show views of an assembly of a heatsink assembly and board, including a chip, according to embodiments of the present technology.
Figure 1B:
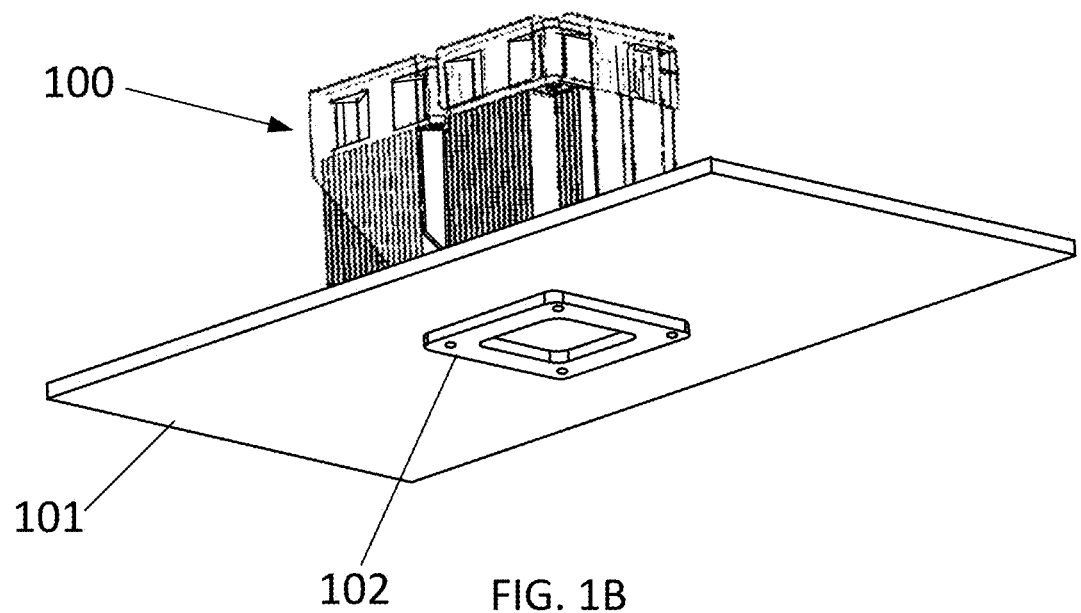

FIG. 1A shows a top perspective view of a heatsink assembly 100 coupled to a board 101. The board 101 may be a printed circuit board (PCB) including a plurality of electrical components (e.g. chips, capacitors, resistors, transistors, sensors, LEDs, etc.), which are omitted in some figures for clarity. As shown in FIG. 1B, the heatsink assembly 100 may be coupled to the board 101 with a backing plate 102 positioned on an opposite side of the board 101 as the heatsink assembly 100. In embodiments, the backing plate 102 may be a rectangular metal, e.g. steel, frame defining a border and a central opening.

Figure 1C:
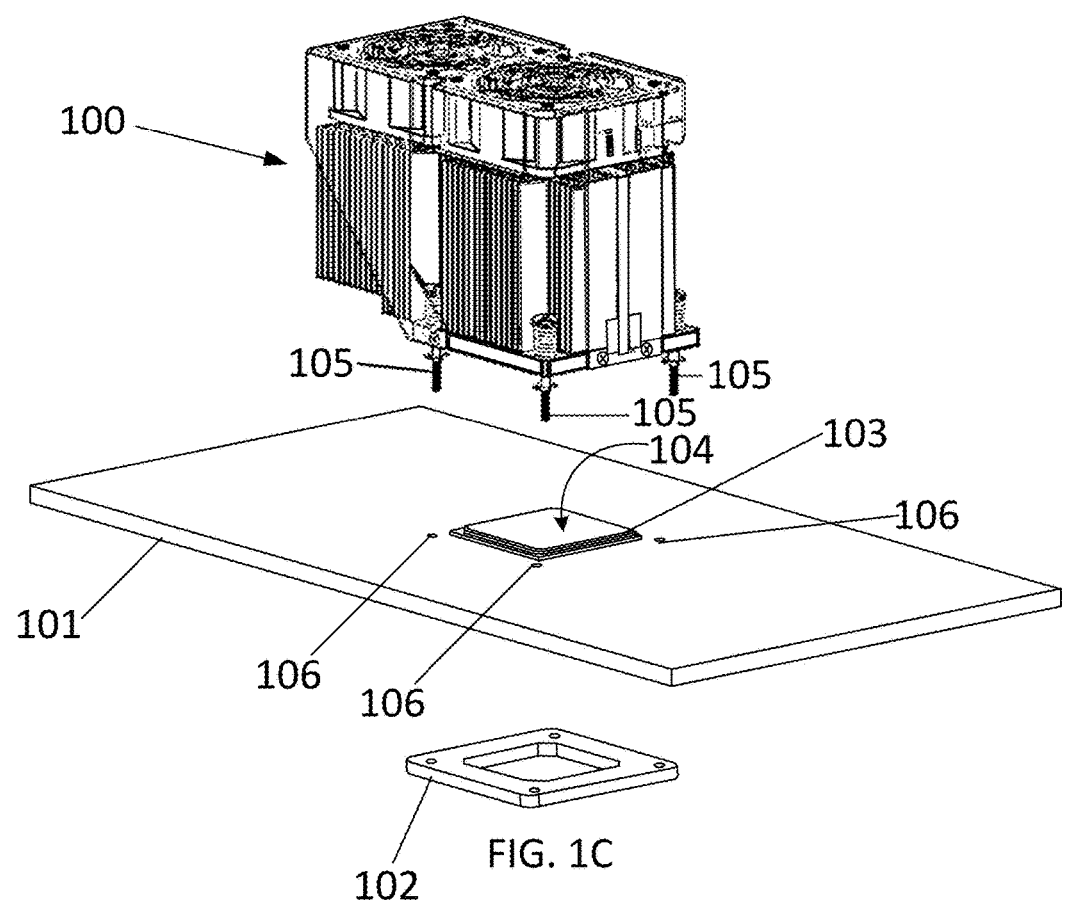

FIG. 1C shows an exploded view of the assembly of FIGS. 1A and 1B. As shown the board 101 includes a chip 103 mounted on a top surface of the board 101. The chip 103 may be for example a processing unit (CPU) and graphics processing unit (GPU). The chip 103 may be substantially square or rectangular and includes a planar top surface 104. The heatsink assembly 100 may be mounted to the board 101 with fasteners 105 extending through holes 106 defined in the board 101 around the chip 103 as shown in FIG. 1C.

Figure 1D:
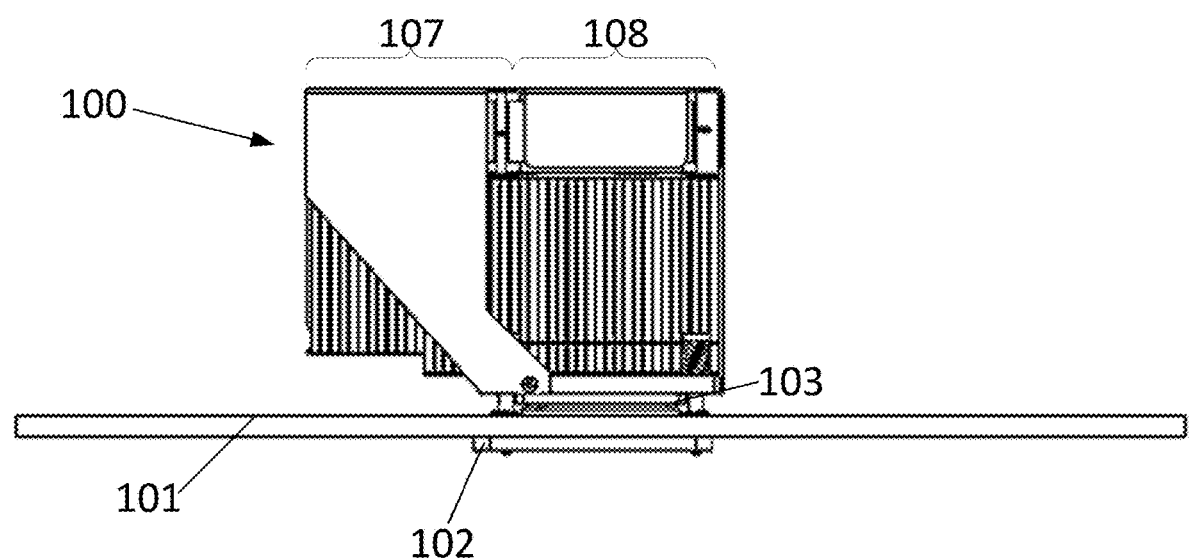

The heatsink assembly 100 is mounted to the board 101 so that a bottom surface of the heatsink assembly 100 contacts the top surface 104 of the chip 103, as shown in FIG. 1D. In other words, a first portion of the heatsink assembly is mounted to the board. As further shown in the side view of FIG. 1D, the side profile of the heatsink assembly 100 is larger than the side profile of the chip 103 so that a second portion of the heatsink assembly 100 overhangs a portion of the board 101 which the heatsink assembly 100 is not directly mounted. In embodiments, as shown in FIG. 1D, the overhanging portion 107 may be about equal in size to the mounted portion 108 so that about half of the heatsink assembly is overhanging the board 101 without any support or contact of the heatsink assembly with the board in the overhanging portion. In embodiments, the first portion of the vapor chamber, the mounted portion 108, extends a first distance in a first direction along the top surface of the base 301, and the second portion, the overhanging portion 107, of the vapor chamber extends a second distance in the first direction past the edge of the base 301, so that the second distance is at least 20% of the first distance. In embodiments, the second distance may be at least 50% of the first distance, including up to or exceeding 100% so that the overhanging portion may be larger than the mounting portion in some embodiments.

As shown in FIG. 1D, in embodiments, the heatsink assembly 100 overhangs the board 101 in one direction, specifically to the left as shown in the figure. However, in embodiments, the heatsink assembly 100 may overhang the board 101 in multiple directions around the chip 103 which the heatsink assembly 100 is mounted over. For example, the heatsink assembly may have a rectangular profile with a long dimension and a short dimension and be mounted over a square chip with sides of the short dimension, with the chip is positioned in the middle of the rectangular profile so that the heatsink assembly overhangs the chip on two opposite sides. Further for example, the heatsink assembly may have a square profile three times the dimensions of a chip and the heatsink assembly may be mounted over the chip in the middle of the square profile so that the heatsink assembly overhangs the chip in all directions by a distance equal to the dimensions of the chip. The overhanging portion of the heatsink assembly allows the heatsink assembly to have increased volume and therefore increased cooling capacity, relative to a heatsink assembly occupying only the volume above a chip. The overhanging portion is beneficial in allowing a high cooling capacity without modifying or enlarging the board due to the need to find real estate for electrical components in an area surrounding the chip.

Figure 2A:
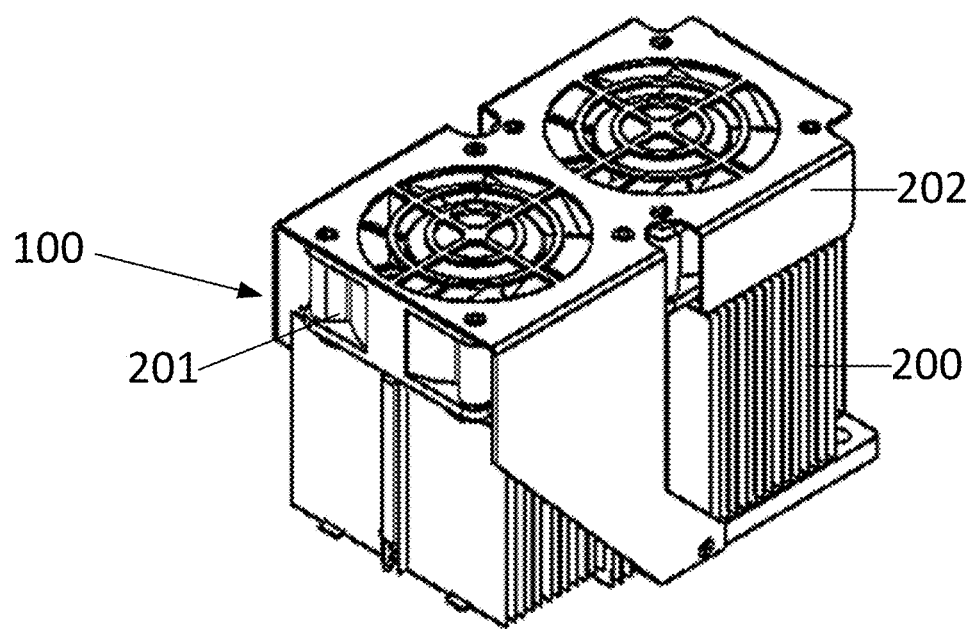
FIGS. 2A and 2B show views of a heatsink assembly according to embodiments of the present technology.
Figure 2B:
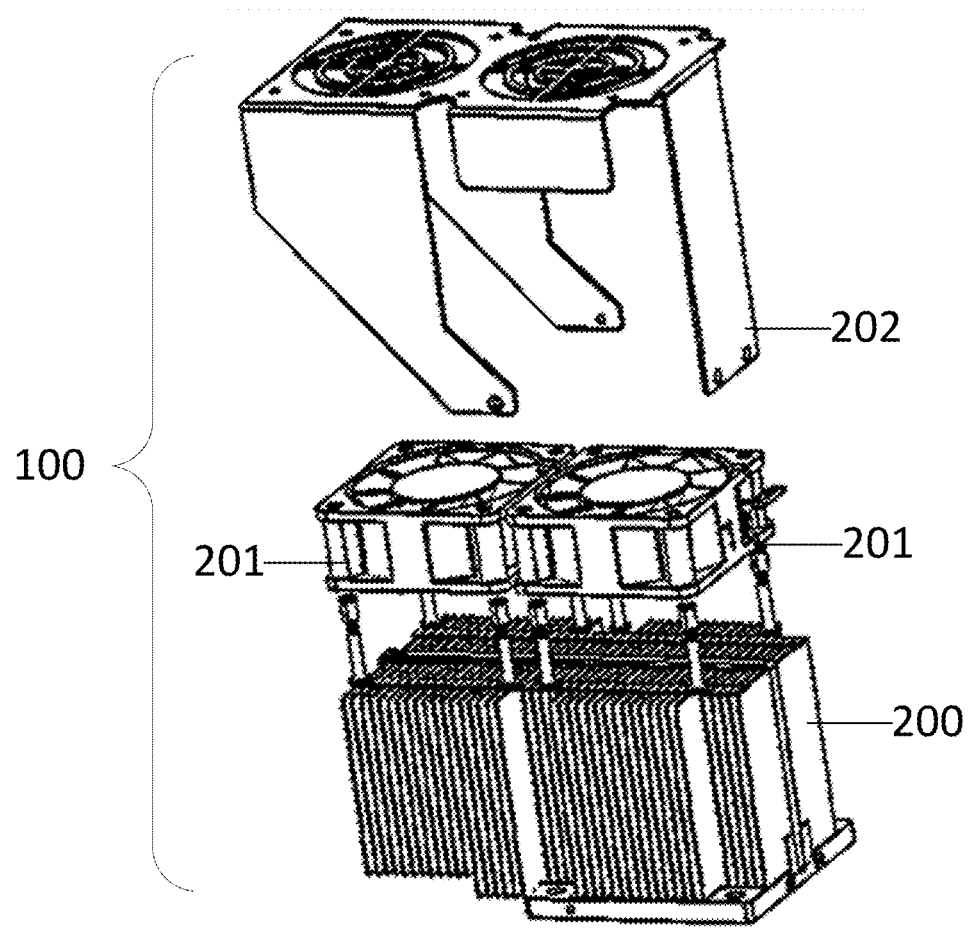

FIG. 2A shows a perspective view of an embodiment of a heatsink assembly 100, and FIG. 2B shows an exploded view. As shown, the heatsink assembly 100 comprises a heatsink 200, fans 201, and a shield 202. As shown, the heatsink assembly 100 may comprise two fans 201, however, in embodiments any number of fans may be included, for example 1, 2, 3, 4, 5, etc. The size of the fans 201 and/or heatsink 200 may be selected so that the one or more fans 201 cover substantially the entire top profile of the heatsink 200. As shown in FIG. 2B, the fans 201 and heatsink 200 share a common width, and the length of the heatsink 200 is about two times the dimension of the fans 201 so that two fans 201 substantially cover the entire top profile of the heatsink 200. As shown, the shield 202 may include a grate covering the fans 201 while still allowing airflow through the heatsink 200. The shield may be formed of stamped sheet metal.

Figure 3A:
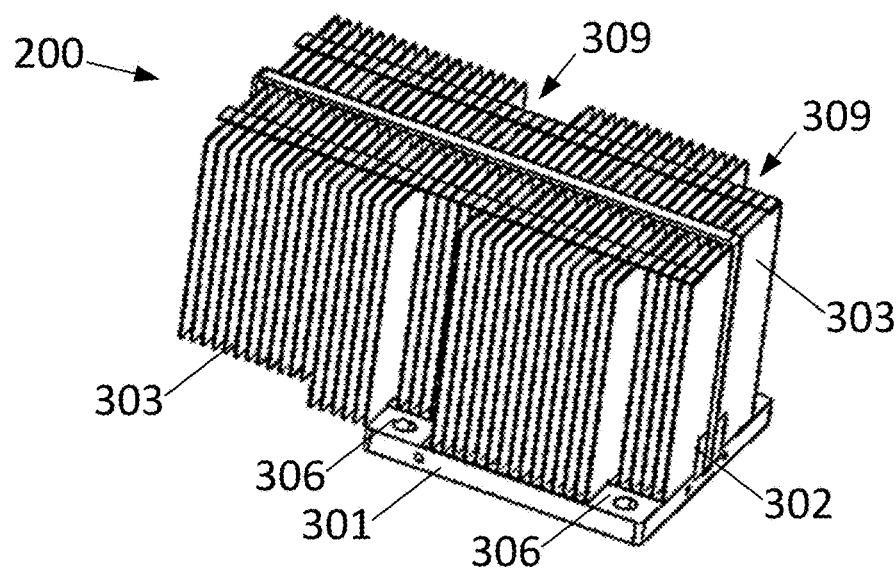
FIGS. 3A-3E show views of a heatsink according to embodiments of the present technology.
Figure 3B:
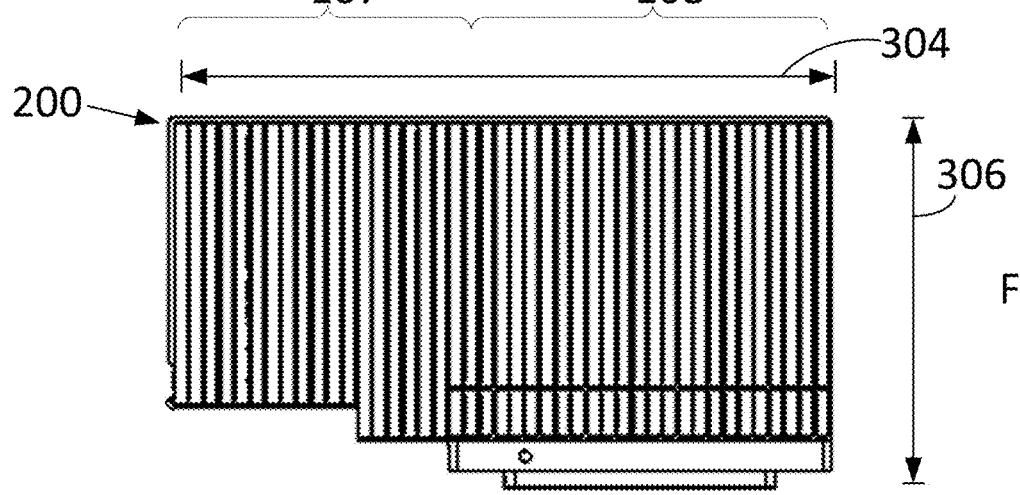

FIGS. 3A-3E show views of an embodiment of a heatsink 200. The heatsink 200 comprises a base 301, a vapor chamber 302 and two cooling fin assemblies 303. As shown, the heatsink 200 may occupy a volume that is substantially a rectangular prism in shape, and is defined by a length 304, a width 305 and a height 306. The base 301 is generally planar and is positioned on a bottom side of the heatsink 200. The base 301 may extend substantially entirely across the width 305 of the heatsink 200 and extend across a portion of the length 304 of the heatsink 204 in order to define the overhanging portion 107, as shown in FIG. 3B. For example, the base 301 may extend about half the length 304 of the entire heatsink 200, as shown in FIG. 3B.

Figure 3C:
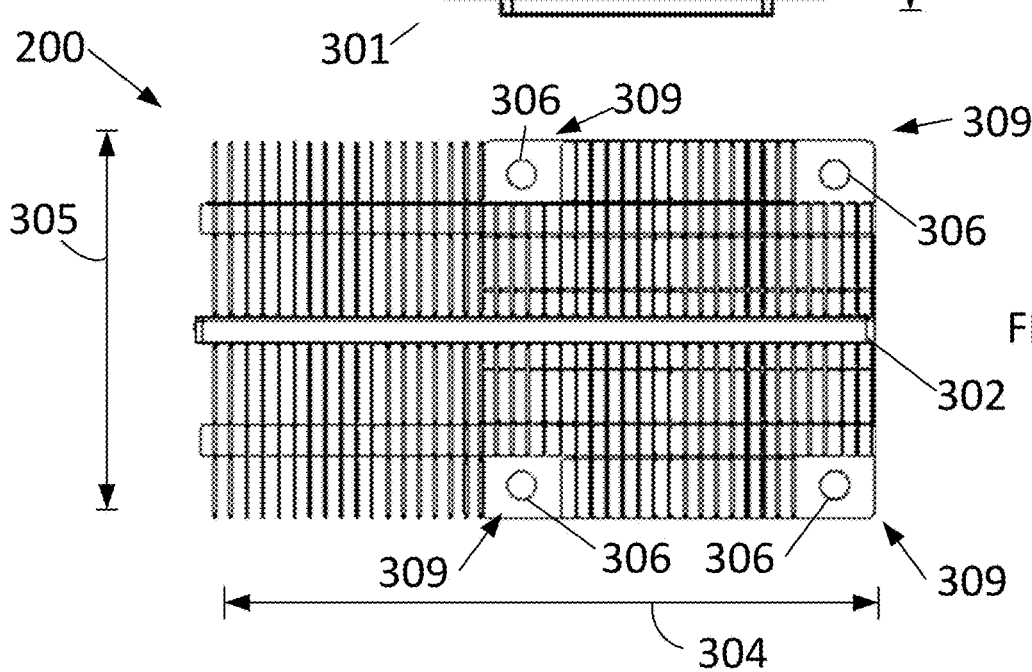
Figure 3D:
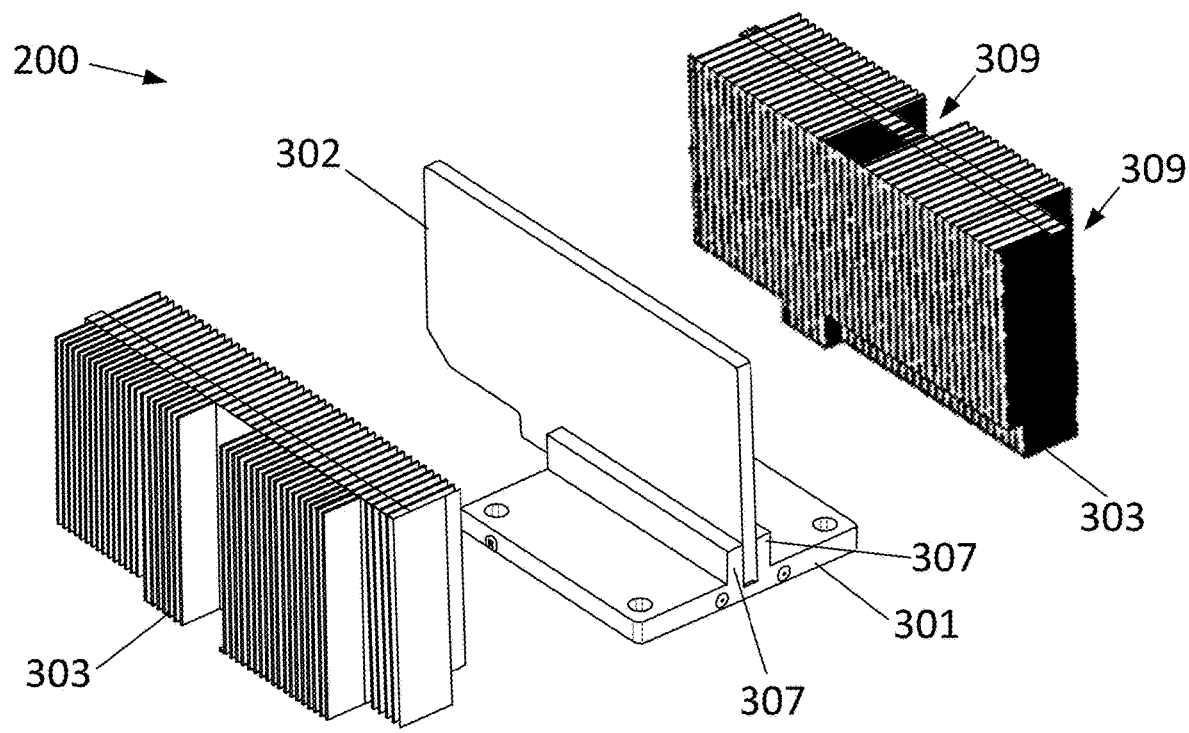
Figure 3E:
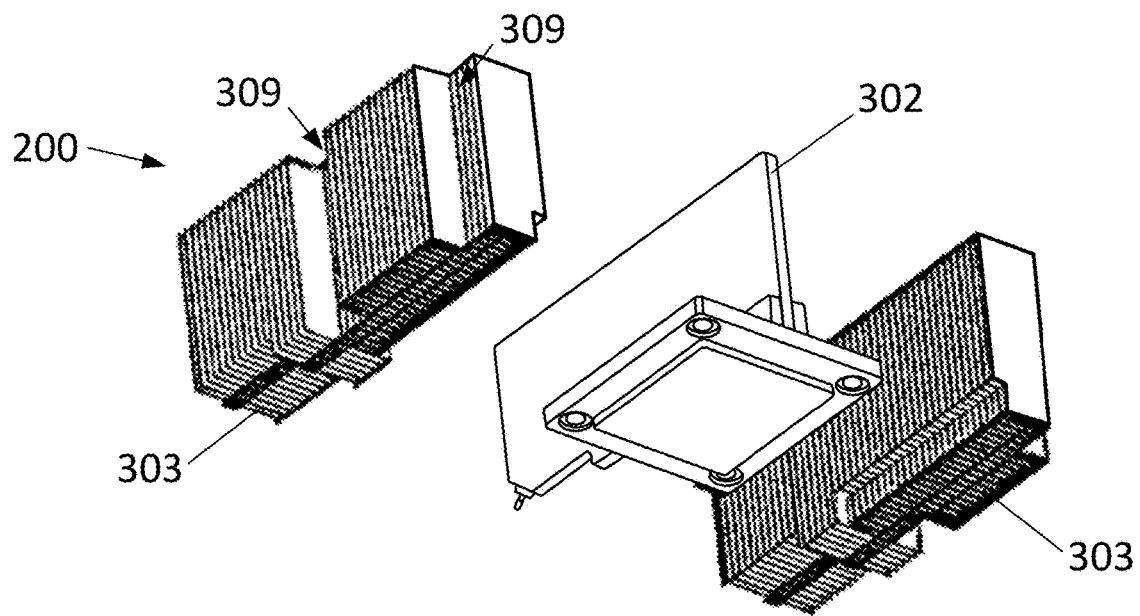

As shown in the exploded views of the heatsink 200 in FIGS. 3D and 3E, the vapor chamber 302 is substantially planar and extends perpendicularly from the base 301. In embodiments, for example as shown, the vapor chamber 302 may be positioned substantially in the middle of the base 301. In the embodiment shown, the heatsink 200 includes a single vapor chamber 302 extending perpendicularly from the base 301, however, in other embodiments a heatsink may include two or more vapor chambers extending perpendicularly from the base.

As shown in FIGS. 3D and 3E, the heatsink 200 may include mounting blocks 307 coupled to the base 301 and/or the vapor chamber 302. The mounting blocks 307 may provide support and/or define conduction paths for transferring heat between the base 301 and vapor chamber 302, in addition to conduction paths defined by the direct contact of the vapor chamber 302 and the base 301. The mounting blocks 307 may be rectangular prisms and extend across the base 301 in the direction of the length 304 the heatsink 200, and the vapor chamber 302 may extend substantially across the entire length 304 and height 306 of the heatsink 200.

The cooling fin assemblies 303 may be coupled to opposite planar side surfaces of the vapor chamber 302. The cooling fin assemblies 303 each comprise a plurality of stacked planar cooling fins. The planar cooling fins may be arranged to be spaced apart and parallel to each other. As shown, the cooling fins may further be arranged to be perpendicular to the vapor chamber 302 and the base 301 in order to define airflow paths from the fans 201 toward the base 301. As shown in the top view of FIG. 3C, the assembly of the two cooling fin assemblies 303 and the vapor chamber 302 extends across the length 304 and width 305 of the heatsink 200 so that the cooling fins assemblies 201 are within both the overhanging portion 107 and the mounted portion 108 of the heatsink assembly 100.

As shown in FIGS. 3A and 3C, a portion of the cooling fin assemblies 201 are positioned over mounting holes 306 of the base 301, and the cooling fins in the portion may be shorter in the direction of the width 305 than adjacent cooling fins in order to define recesses 309 for accessing the fasteners 105 securing the heatsink 200 to a board 101. As shown in FIG. 3B, cooling fins of a portion of the cooling fin assemblies 201 in the overhanging portion 107 may be shorter in the direction of the height 306, than fins in the mounted portion 108, and correspond in height to the height of the vapor chamber 302 in the overhanging portion 107 in order to partially define the overhanging portion 107.

FIGS. 4A-4C shows views of a heatsink subassembly 400 comprising the vapor chamber 302, the base 301 and the mounting blocks 307. As shown, the vapor chamber 302 may extend along a middle line of the base 301 and extend beyond the base 301 to define the overhanging portion 107. Further, the portion of the vapor chamber 302 extending beyond the base 301 may include portions 310 recessed in the direction of the height 306 in order to define an increased clearance over the board so that the cooling fin assemblies 201 do not interfere with electrical components on the board adjacent to the chip 103 to be cooled and under the overhanging portion 107.

FIGS. 5A-5F shows views of an embodiment of a vapor chamber 302. As shown in the side profile view of FIG. 5B, a vapor chamber 302 may define a top edge 501, a base side edge 502, a bottom edge 503, and an overhang side edge 504. The top edge 501 may be substantially straight and flat and corresponds to the top side of the heatsink 200. The base side edge 502 and overhang side edge 504 may be substantially straight and flat and correspond to the end sides of the heatsink 200.

The bottom edge 503 of the vapor chamber 302 may comprise a stepped profile defining a mounting portion 505 and an overhanging portion 506, corresponding to the mounted portion 108 and overhanging portion 107 of the heatsink assembly 100, respectively. In the heatsink subassembly 400, the mounting portion 505 is positioned within and/or over the base 301, and the overhanging portion 506 is not over the base 301 and defines the overhanging portion 107 of the heatsink 200.

The mounting portion 505 may include a first tab, referred to as a slot tab 508, and a second tab, referred to as a base tab 507. The base tab 507 may extend across the width of the mounting portion and be offset from the adjacent overhang portion 506. The slot tab 508 may extend from the base tab 507. In FIG. 5B, the base tab 507 and slot tab 508 are delineated with dashed lines for purposes of visualization. As shown, the base tab 507 and the slot tab 507 define the stepped profile. As shown, the base tab 507 extends further from the top edge 501 of the vapor chamber 302 than an overhang edge 516 in the overhang portion 107. Further, the slot tab 508 tab extends from the base tab 507 and extends further from the top edge 501 of the vapor chamber 301 than the base tab 507.

Figure 5A:
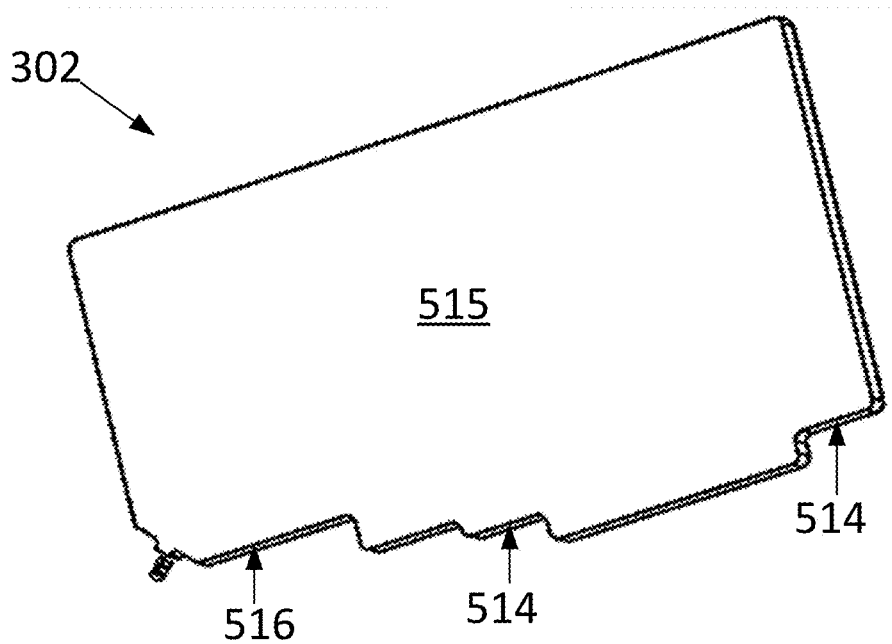
FIGS. 5A-5F show views of a vapor chamber according to embodiments of the present technology.
Figure 5B:
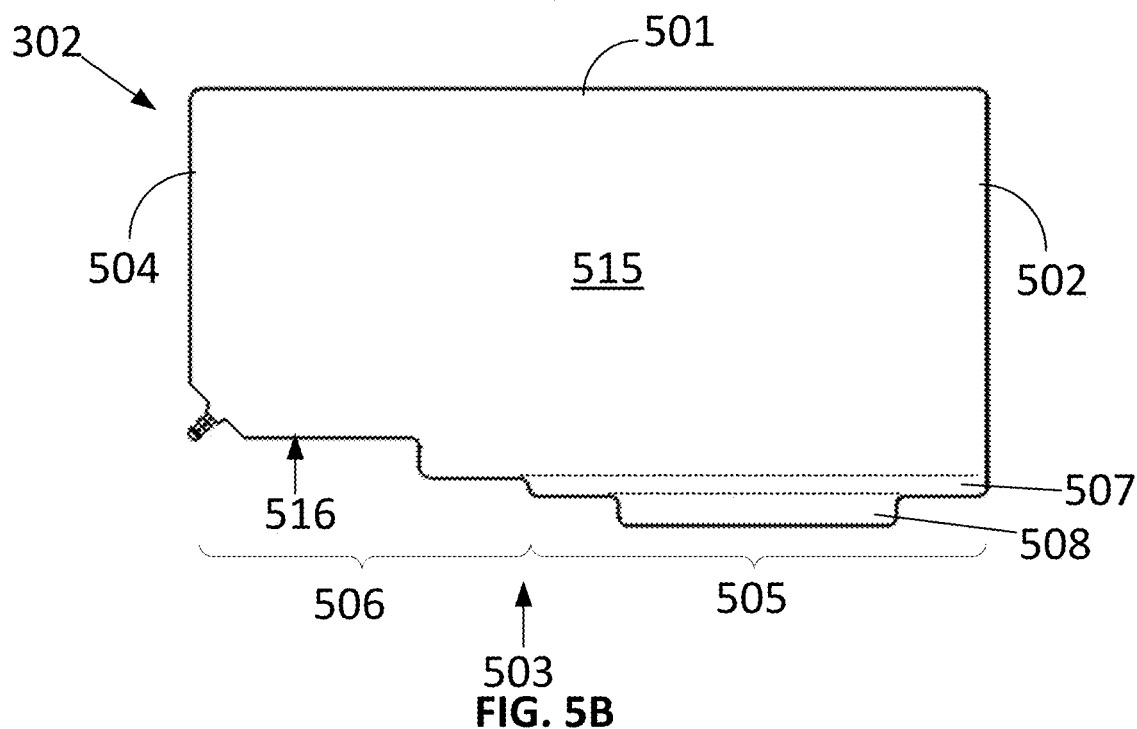

As shown in FIG. 5A, the planar side of the vapor chamber 301 including the base tab 507 and slot tab 508 may be a continuous planar surface. As shown in FIG. 5B, the base tab 507 and slot tab 508 may each be substantially rectangular in profile. As shown, the slot tab 508 may extend from a central portion of the base tab 507 so that the slot tab 508 is between two end surfaces 514 of the base tab 507.

Figure 5C:
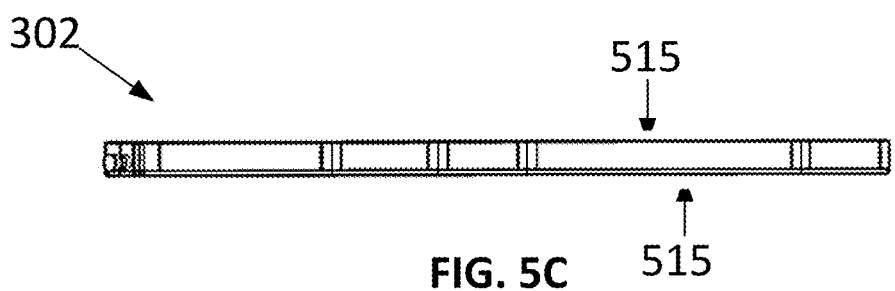

As noted, the vapor chamber 302 may be substantially planar comprising two planar side surfaces 515 closely spaced to define a thickness of the vapor chamber 302, as is shown in the bottom view of FIG. 5C. As shown, the vapor chamber 302, including the base tab 507 and slot tab 508, may have a uniform thickness. In embodiments, the thickness may be between 4 mm and 20 mm.

Figure 5D:
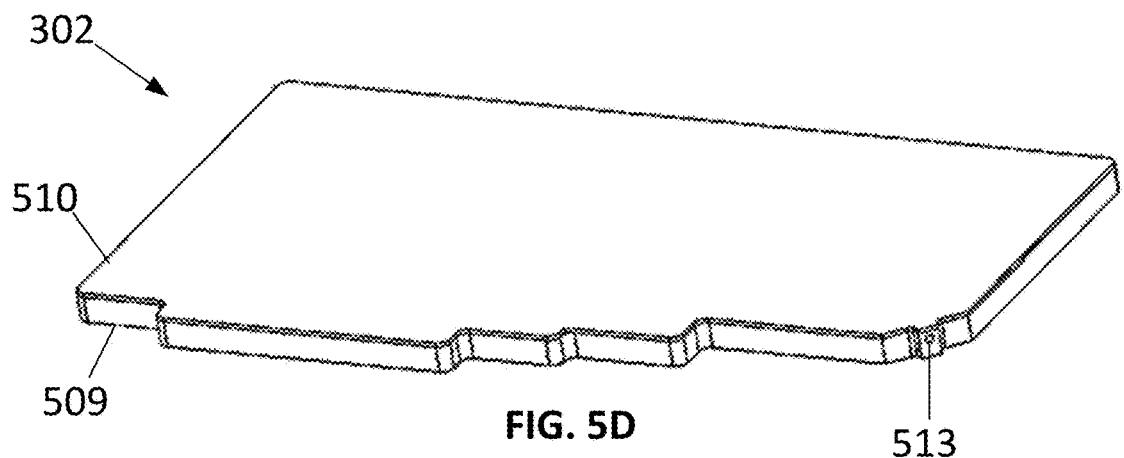
Figure 5E:
Figure 5F:
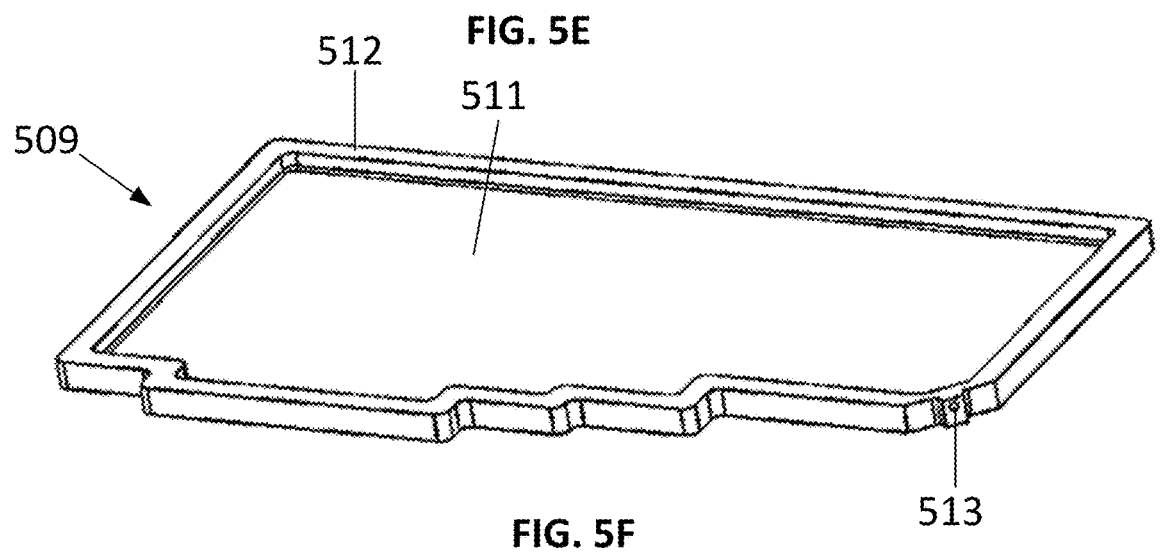

The vapor chamber 302 may be formed of a plurality of components. For example, in embodiments, the vapor chamber 302 may be comprised of an open sided body 509, as shown in FIG. 5F and a side plate 510 as shown in FIG. 5E. The body 509 may comprise a planar panel 511 and a wall 512 around a perimeter of the planar side 511 in order to define a cavity. The wall 512 may define a fill port 513 for filling the vapor chamber 302 with a fluid. The fill port 513 may be located at a corner of the vapor chamber 302 as shown in FIG. 5D. The side plate 510 may be planar and formed of a sheet of metal, for example copper. The body 509 may be formed of a stamped or machined piece of metal, for example copper.

The body 509 and side plate 510 may have identical profiles, as shown in FIGS. 5E and 5F. The side plate 510 may be coupled to the wall 512 to form the vapor chamber 302 so that both the side plate 510 and wall 512 define the top edge 501, the base side edge 502, the bottom edge 503, and the overhang side edge 504, as shown in FIG. 5D. As shown in FIG. 5F, the cavity of the vapor chamber 302 forms a portion of both the base tab 507 and slot tab 508. The side plate 510 may be coupled to the body 509 for example by brazing, welding, and/or adhesives.

The vapor chamber 302 forms a sealed vessel and is filled with fluid. When a surface of the vapor chamber 302 is heated, the fluid within the vapor chamber adjacent to the heated surface is vaporized. The vaporized fluid migrates to a cooler surface of the vapor chamber and condenses. In some embodiments, one or more internal surfaces of the vapor chamber 302 may include a porous structure, formed for example with a sintering process. The porous structure, through wicking action, causes condensed fluid to travel along the porous structure to the heated portion of the vapor chamber. In some embodiments, during use, a vapor chamber 302 may be oriented so that the heated surface or end of the vapor chamber is at a low point relative to gravity, in order for gravity to assist the migration of condensed fluid to the heated portion of the vapor chamber. In some embodiments, the vapor chamber 302 may operate independent of gravity and the condensed fluid may flow to the heated surface regardless of the orientations relative to gravity of the heated surface(s) and the cooler surface(s), for example embodiments including porous structures. The vaporization and condensation cycle facilitated heat transfer from the base 301 to the cooling fins assemblies 201.

FIGS. 6A-6D show views of an embodiment of a base 301. The base plate includes a top side 601 and a bottom side 602. The bottom side 602 may include a generally flat bottom surface 603 for contacting the chip 103, as shown in FIG. 1D. The bottom surface 603 may substantially correspond to the size and shape of the top surface 104 of the chip 103. In embodiments the bottom surface 603 may be surrounded by a recessed fringe surface 604. The mounting holes 306 for receiving mounting fasteners may extend through the base 301 from the top side 601 to the fringe surface 604. As shown, the base 301 may be rectangular with a mounting hole 306 at each corner. In embodiments, the base 301 may define a length 310 in direction of the length 304 of the heatsink.

The top side 601 of the base 301 includes a top surface 605 and a mounting interface 606. The mounting interface 606 is recessed relative to the top surface 605 in order to receive the vapor chamber 302, and mounting blocks 307. The mounting interface 606 includes two first recessed surfaces 609 extending along the length 310 of the base 301 and recessed relative to the top surface 605. Between the two first recessed surface 606 are two second recessed surface 607 and a central slot 608. The second recessed surfaces 607 are recessed relative to the first recessed surfaces 606. As shown, the central slot 608 is positioned between the two first recessed surfaces 606 and the two second recessed surfaces 607.

The first recessed surfaces 606 may be rectangular and sized and shaped to correspond to the shape and size of the mounting blocks 307. The second recessed surfaces 607 and the central slot 608 may each be rectangular and sized and shaped to correspond to the shape and size of the base tab 507 and slot tab 508, respectively. The depth of the central slot 608 corresponds to the distance the slot tab 508 extends from the base tab 507 so that the end of the slot tab contacts the bottom of the central slot 608 to form a heat transfer path between the base 301 and vapor chamber 302.

In embodiments, the length 304 of the heatsink 200 may be greater than the length 310 of the base 301 so that the overhanging portion 107 extends beyond an edge of the base 301 by a distance of at least 20% of the length of the base, and in some embodiments by a distance of at least 50% or more. In embodiments, the top plane area of the base as shown in FIG. 6B, may be between 20% and 80% of the top plane area of the heatsink 200, as shown in FIG. 3C, such that a portion of the heatsink overhangs the base in at least one direction.

The base 301 may be formed from a single or multiple pieces of material. In embodiments, the mounting blocks may be formed integrally or separately from the base. The base and mounting blocks may be formed of materials with high thermal conductivity, for example copper. In embodiments, the base 301 may be formed of solid copper. The base and/or mounting blocks may be formed for example by machining or casting.

Figure 7A:
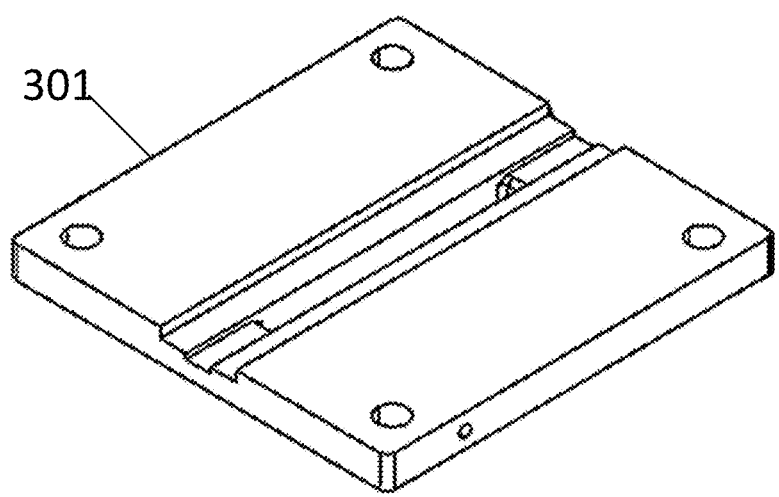
FIGS. 7A-7F show steps of assembling a heatsink assembly according to embodiments of the present technology.
Figure 7B:
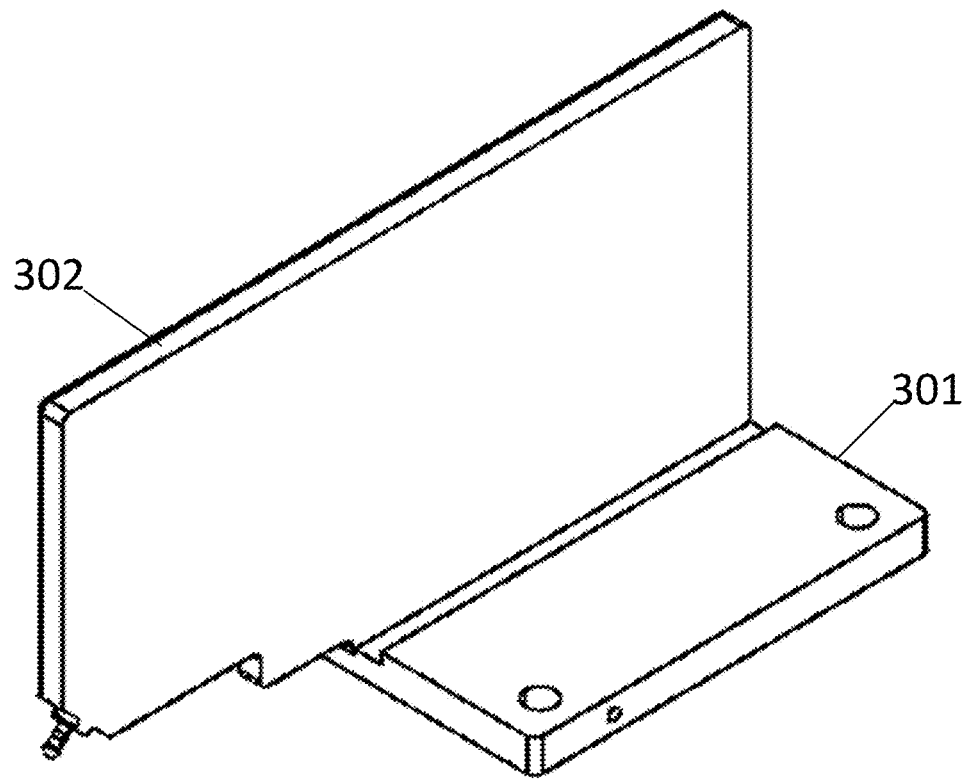

FIGS. 7A-7F show steps of an embodiment of assembling a heatsink assembly 100. As shown in FIG. 7A, assembling a heatsink assembly 100 may begin with providing a base 301, as discussed above. With the base 301 provided, an assembled vapor chamber 302 may be coupled to the base 301 by inserting the slot tab 508 into the central slot 608 so that the ends 514 of the mounting tab 507 are against the second recessed surfaces 607, as shown in FIG. 7B. The tolerances of the slot tab 508 and central slot 608 may form a press-fit coupling the base 301 to the vapor chamber 302. Additionally or alternatively, the vapor chamber 302 and base 301 may be coupled together, with brazing, welding, and/or adhesives.

Figure 7C:
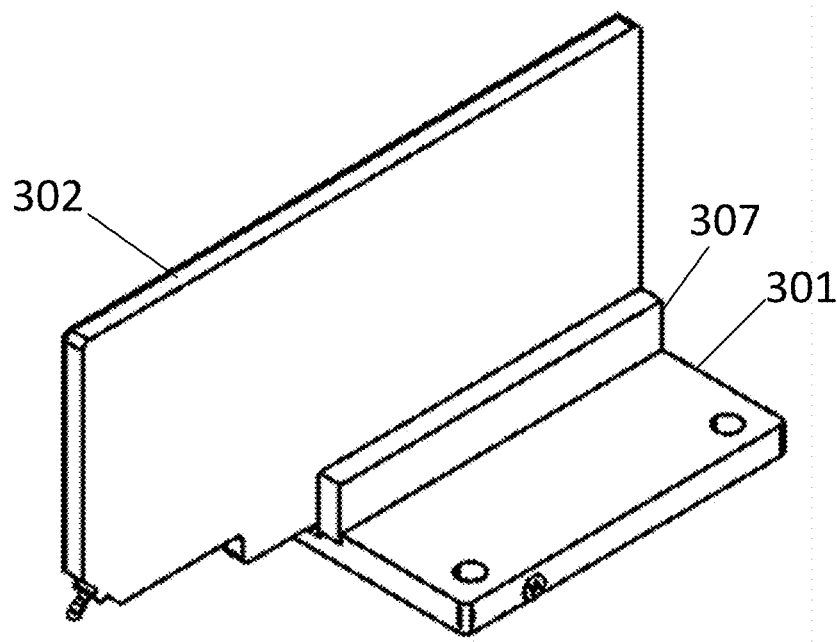

With the vapor chamber 302 extending perpendicularly from the base 301, as shown in FIG. 7B, the mounting blocks 307 may be positioned against the first recessed surfaces 609, and coupled to the base 301 and/or the vapor chamber 302, as shown in FIG. 7C. The coupling of the mounting blocks 307 to the base 301 and/or vapor chamber 302 may include brazing, welding, and/or adhesives. In embodiments, the mounting blocks 307 may be coupled to the base 301 before, during, or after coupling the vapor chamber 302 to the base 301.

Figure 7D:
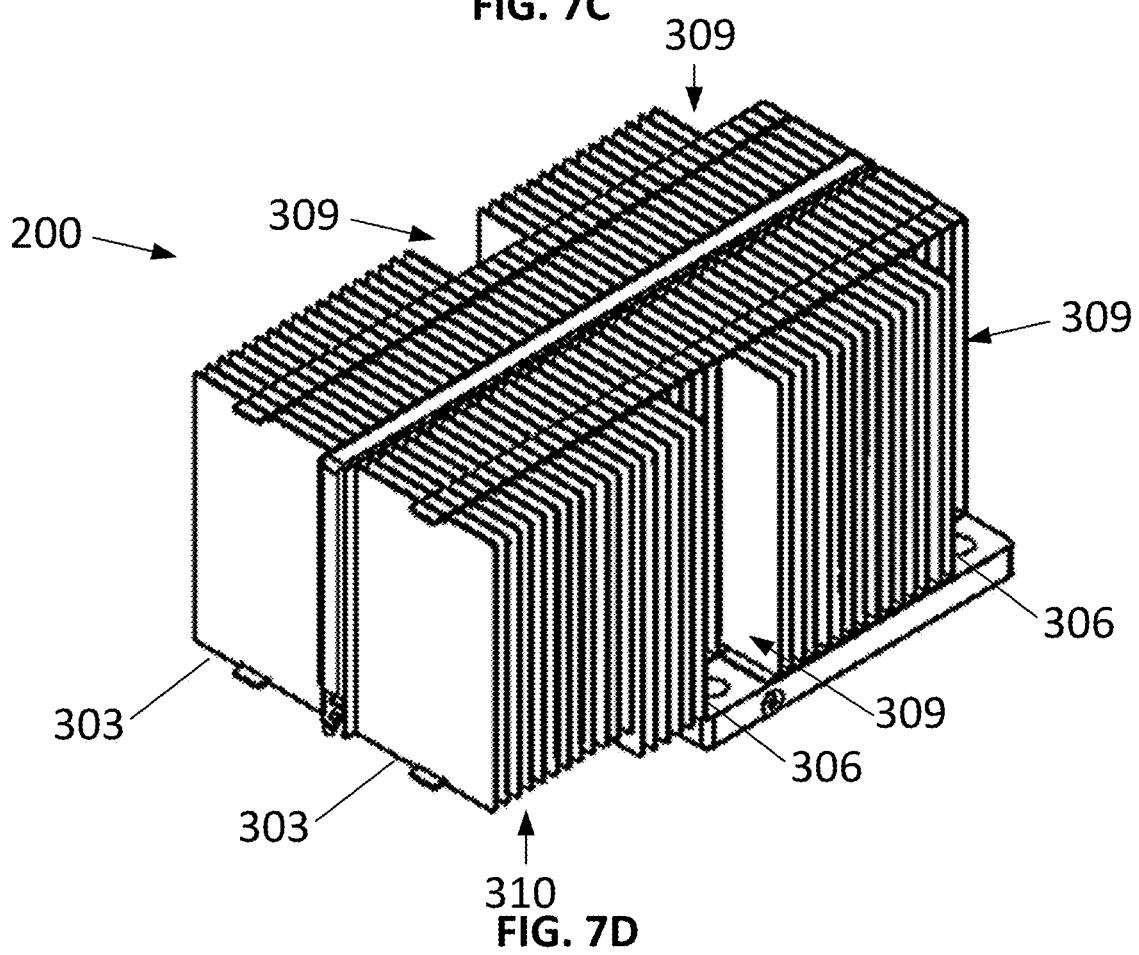

With the vapor chamber 302, mounting blocks 307, and base 301 coupled together, as shown in FIG. 7C, the cooling fin assemblies 303 may be coupled to the sides of the vapor chamber 302, as shown in FIG. 7D. The coupling of the cooling fin assemblies to the vapor chamber may include brazing, welding, and/or adhesives. As shown, the portions 310 of the cooling fin assemblies 303 with shorter cooling fins in the direction of the height are positioned in the overhanging portion 107, and the recesses 309 of the cooling fin assemblies 303 are positioned over the mounting holes 306. In embodiments, the cooling fin assemblies may be coupled to the vapor chamber before, during, or after coupling the vapor chamber to the base.

Figure 7E:
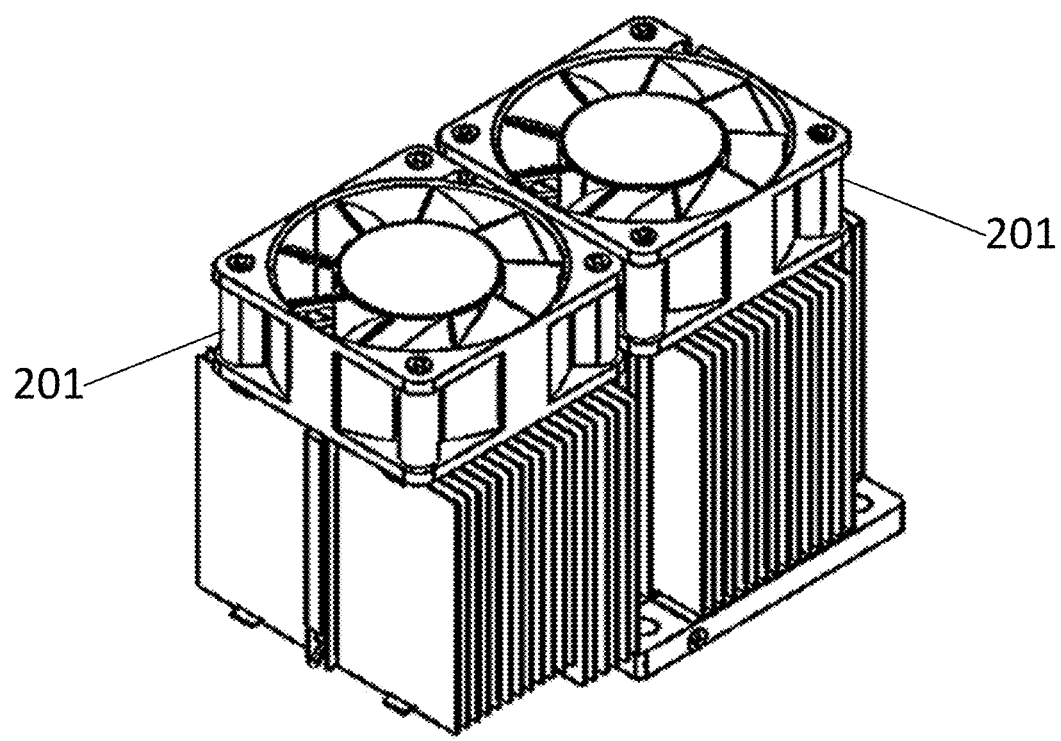
Figure 7F:
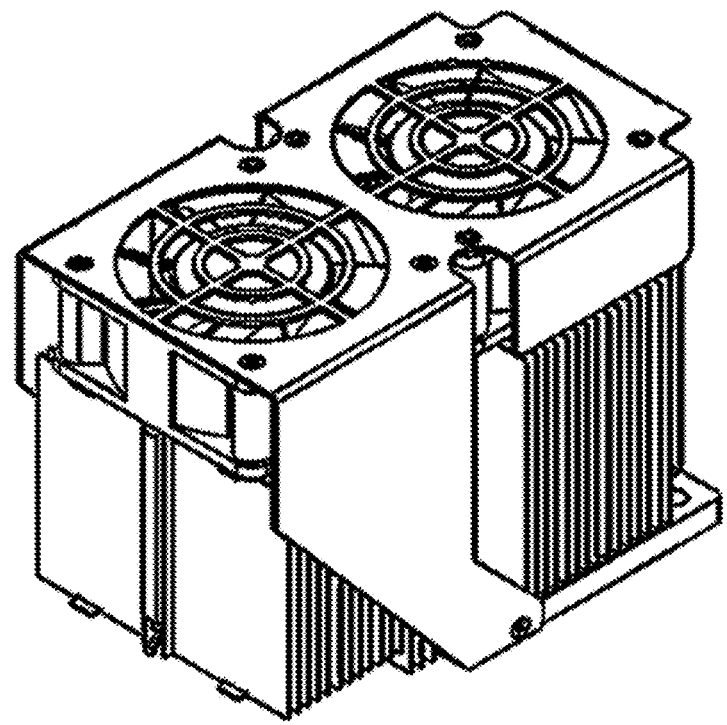

With the vapor chamber 302, mounting blocks 307, base 301, and cooling fin assemblies 303 coupled together, fans 201 may be mounted on top of the subassembly as shown in FIG. 7E. The fans 201 may be coupled to posts extending from and coupled to the subassembly. In order to protect the fans and/or the cooling fin assemblies, a protective shield 202 may be positioned over the fans, and coupled to the base 301 with fasteners, as shown in FIG. 7F.

Figure 8A:
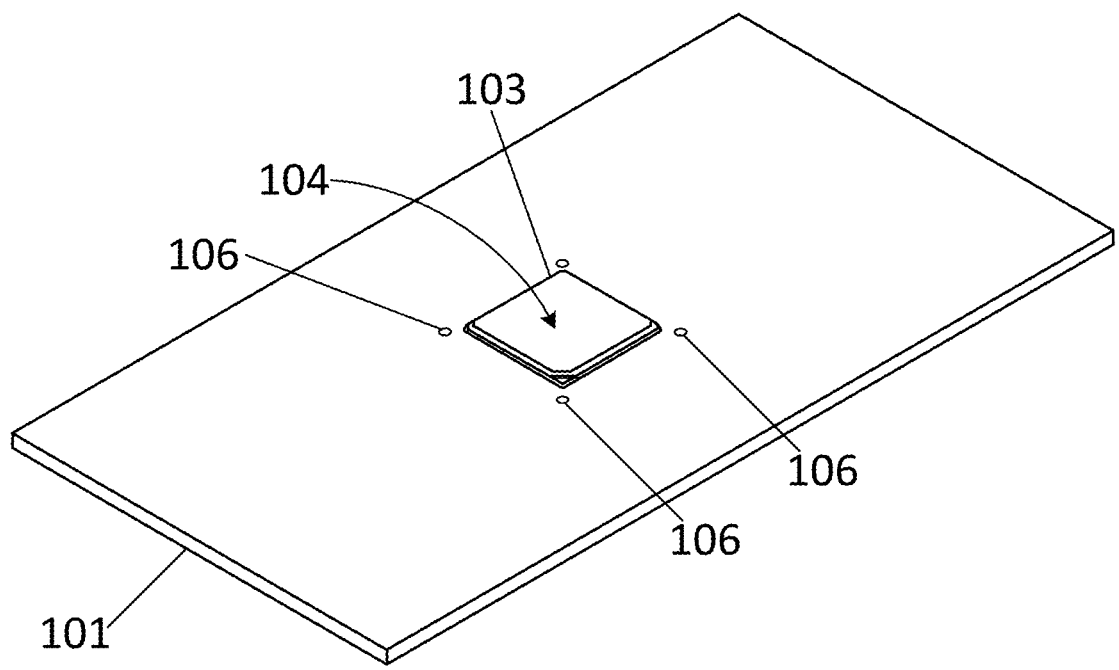
FIGS. 8A-8D show steps of coupling a heatsink assembly onto a chip on a board according to embodiments of the present technology.
Figure 8B:
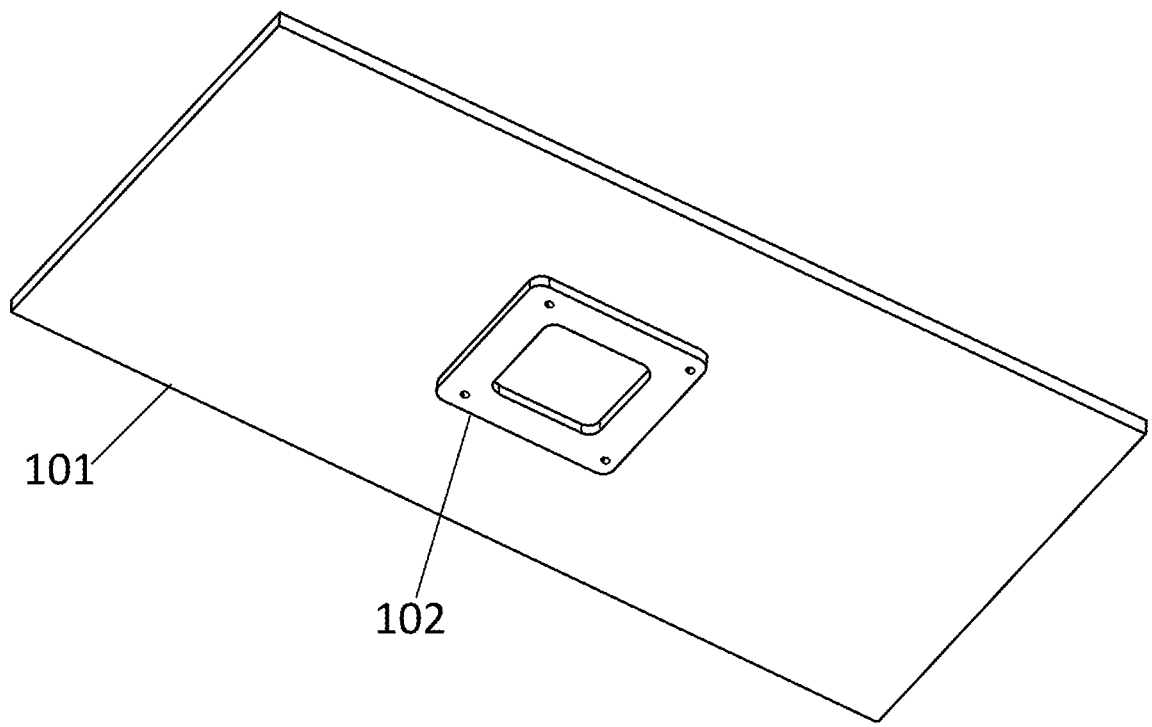
Figure 8C:
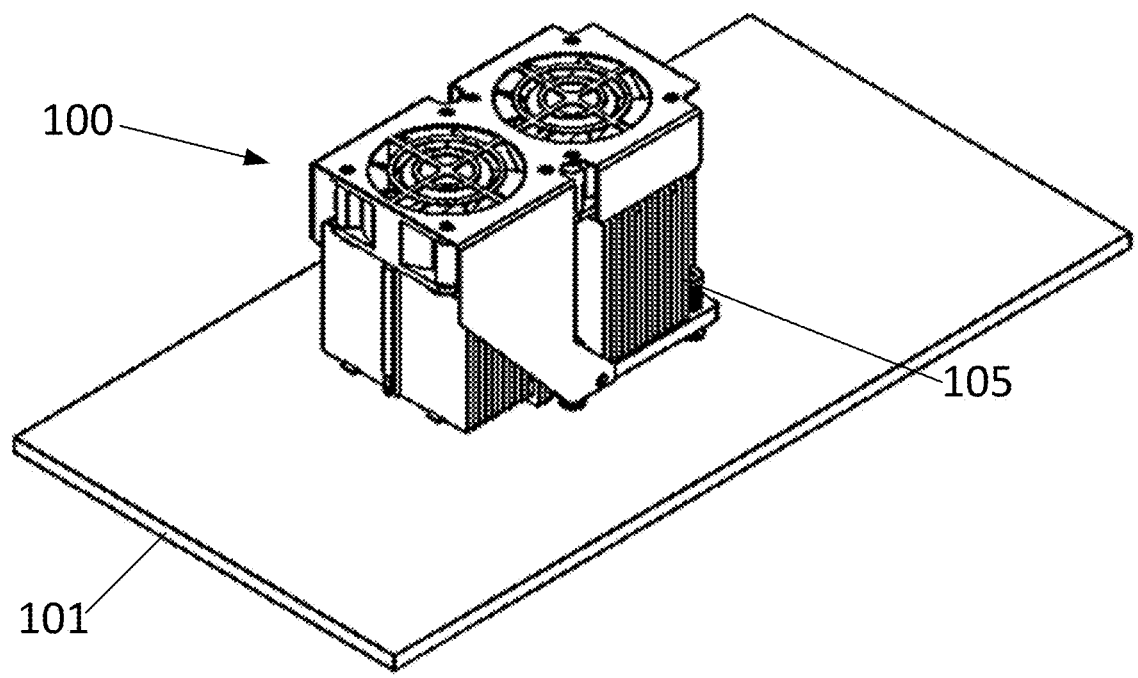

FIGS. 8A-8D show steps of an embodiment of coupling a heatsink assembly 100 on a chip 103 on a board 101. As shown in FIG. 8A, coupling a heatsink assembly 100 may begin with providing a board 101 with a chip 103 and defining mounting holes 106, as discussed above. A support bracket 102 may be positioned under the board 101 on a side opposite the chip 103, as shown in FIG. 8B. The heatsink assembly 100 may be positioned over the chip 103 so that the bottom surface 603 contacts and covers the top surface 104 of the chip 103, as shown in FIG. 8C. In embodiments, a thermal grease may be applied between the bottom surface 603 and top surface 104 in order to enhance thermal conduction from the chip 103 to the heatsink assembly 100. The heatsink assembly 100 may be coupled to the board using fasteners 105. The fasteners 105 may include threaded members threadedly coupled to the backing plate 102, and springs between heads of the threaded members and base 301 in order to apply a compression force of the bottom surface 603 against the chip 103.

Figure 8D:
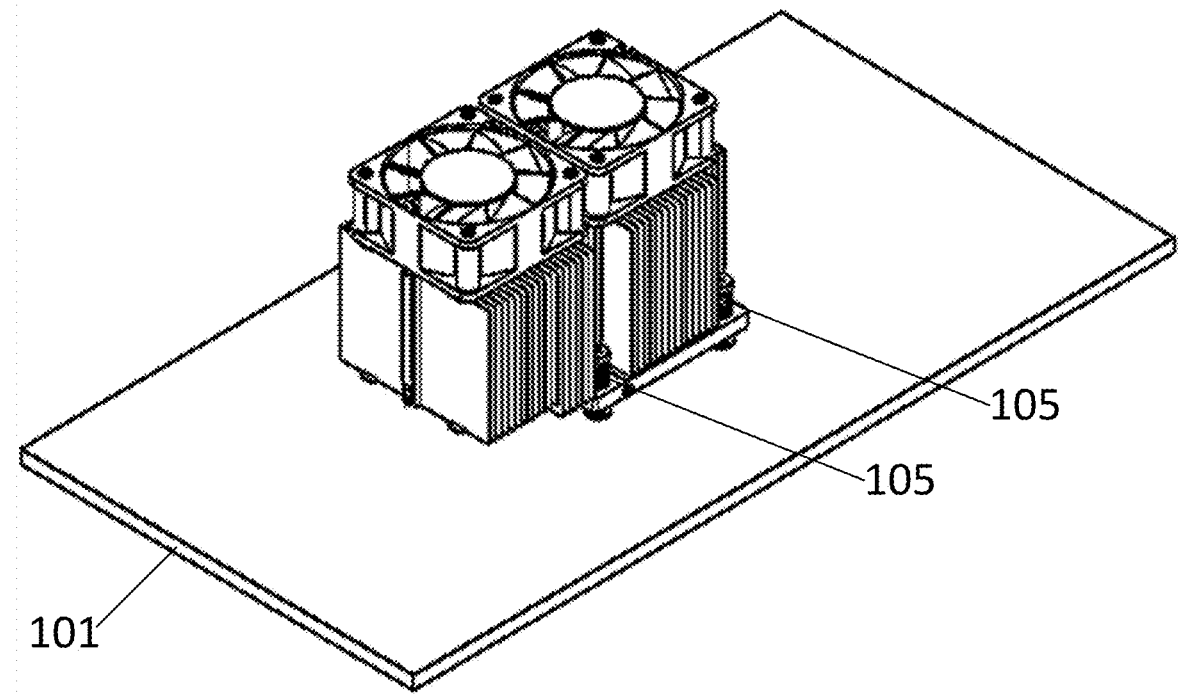

In embodiments, steps of assembling the heatsink assembly 100, for example as shown in FIGS. 7A-7F, may be performed after one or more components of the heatsink assembly 100 are coupled to the board 101. For example, as shown in FIG. 8D, the heatsink assembly 100 without the shield 202 attached may be coupled to the board 101, followed by attaching the shield 202 to the base 301.

Figure 9A:
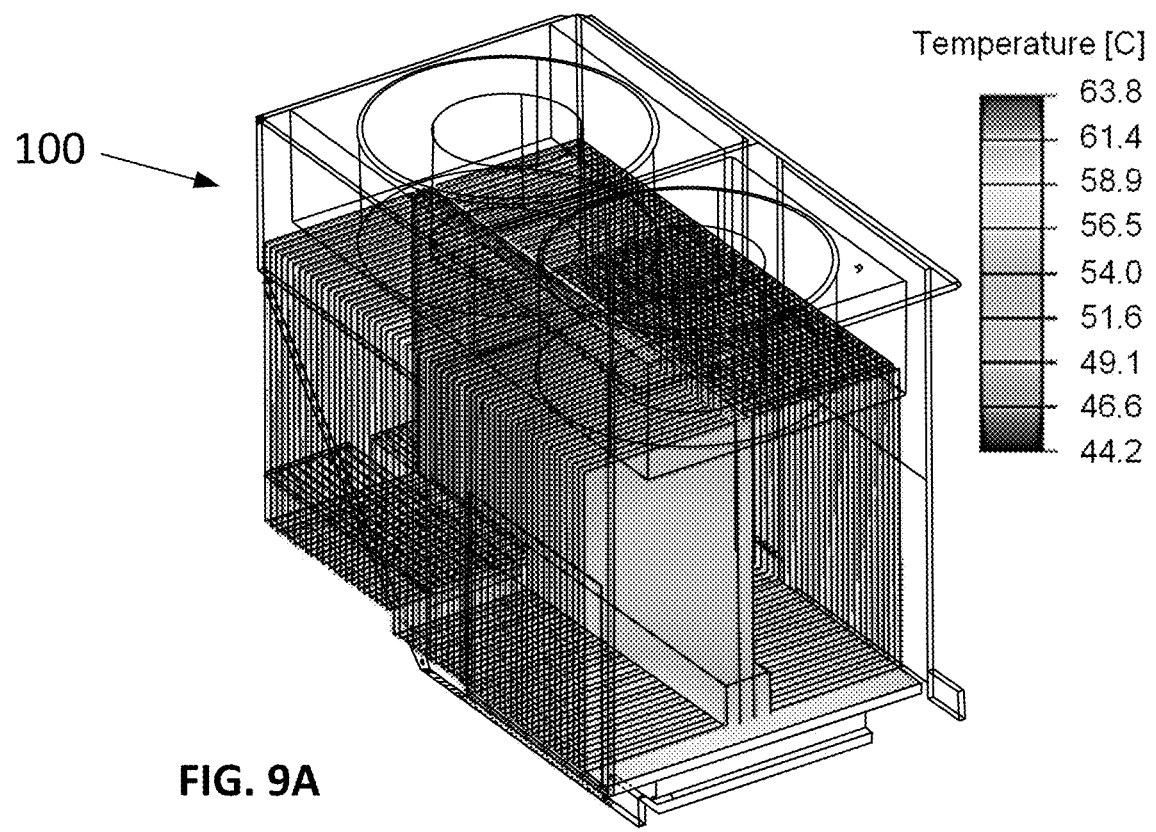
FIGS. 9A-9C show thermal simulations of a heatsink assembly according to embodiments of the present technology.
Figure 9B:
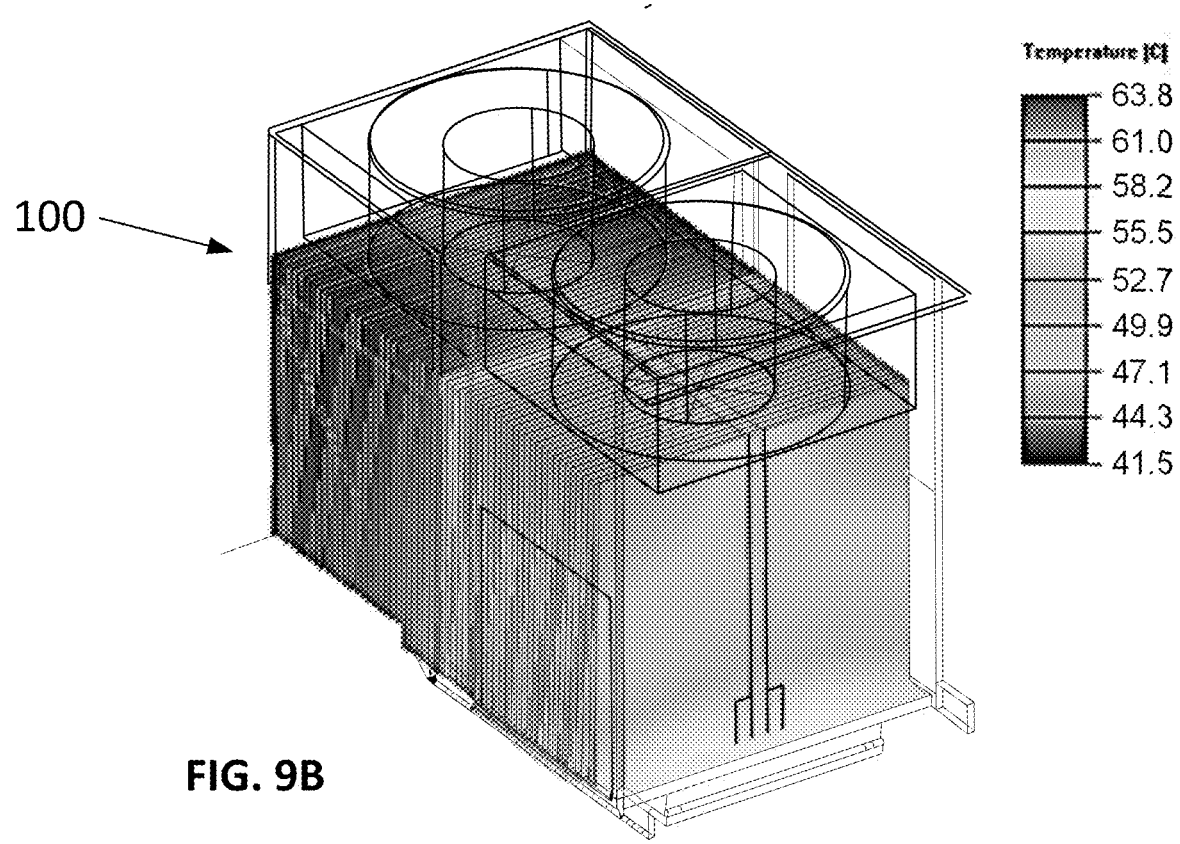
Figure 9C:
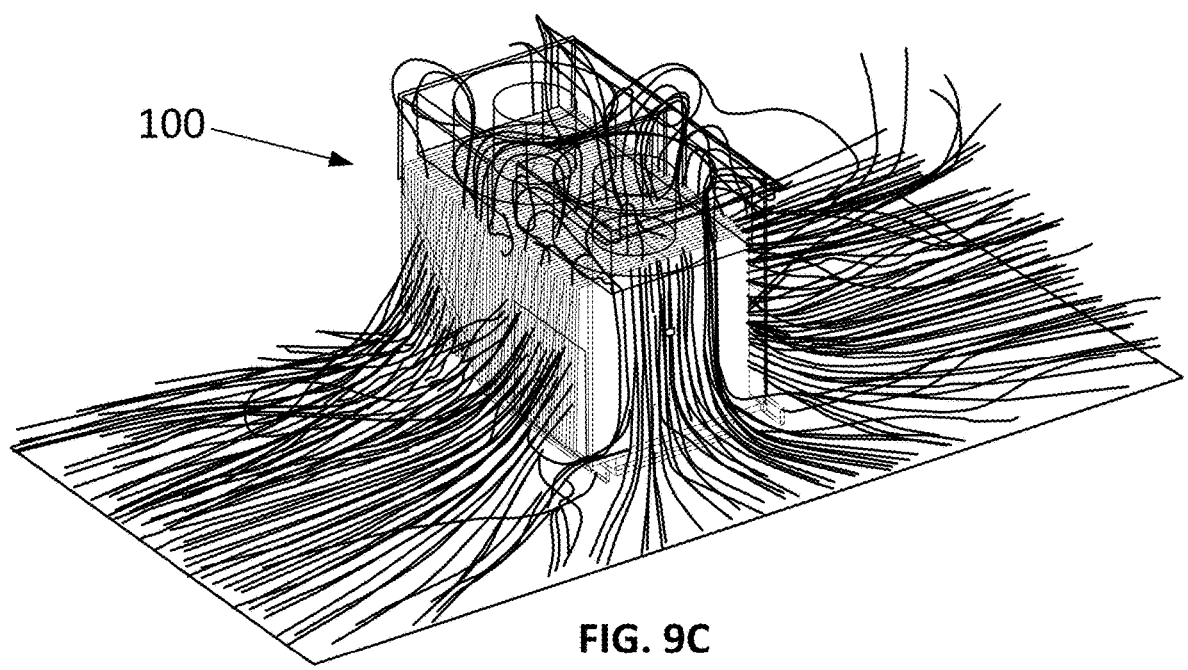

FIGS. 9A-9C show thermal simulations of a heatsink assembly according to embodiments of the present technology. As shown in FIG. 9A, heat from the chip is uniformly distributed within the vapor chamber so that heat is distributed upwardly away from the base and toward the overhanging portion. As shown in FIG. 9B, heat from the vapor chamber is uniformly distributed from the vapor chamber to the cooling fin assemblies. FIG. 9C shows particle traces representing the airflow, caused by the fans, dissipating heat from the heat sink assembly.

The terms "approximately", "about", and "substantially" as used herein represent an amount close to the stated amount that still performs a desired function or achieves a desired result. For example, the terms "approximately", "about", and "substantially" may refer to an amount that is within less than 10% of, within less than 5% of, within less than 1% of, within less than 0.1% of, and within less than 0.01% of the stated amount.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above.

Similarly, this method of disclosure is not to be interpreted as reflecting an intention that any claim require more features than are expressly recited in that claim. Rather, inventive aspects may lie in a combination of fewer than all features of any single foregoing disclosed embodiment. Thus, the claims following the Detailed Description are hereby expressly incorporated into this Detailed Description, with each claim standing on its own as a separate embodiment.

The invention claimed is:

1. A heat dissipation system, comprising:
   a base, wherein the base defines a top surface and a flat bottom surface, opposite the top surface, configured for contacting a chip;
   a vapor chamber, wherein the vapor chamber is planar and comprises two planar side surfaces, wherein the vapor chamber is coupled to the base so that the two planar side surfaces are perpendicular to the flat bottom surface; and
   two cooling fin assemblies, wherein each cooling fin assembly is respectively coupled to one of the two planar side surfaces of the vapor chamber,
   wherein a first portion of the vapor chamber is coupled to the base so that the first portion of the vapor chamber extends along the top surface of the base in a first direction,
   wherein a second portion of the vapor chamber, adjacent to the first portion of the vapor chamber, extends in the first direction past an edge of the base in order to define an overhanging portion, and
   wherein the two cooling fin assemblies are each coupled to both the first and second portions of the vapor chamber so that portions of the two cooling fin assemblies further define the overhanging portion,
   wherein the first portion of the vapor chamber extends a first distance in the first direction along the top surface of the base, and the second portion of the vapor chamber extends a second distance in the first direction past the edge of the base, and
   wherein the second distance is at least 20% of the first distance.

2. The system of claim 1, wherein the second distance is at least 50% of the first distance.

3. The system of claim 1, wherein the vapor chamber defines a top edge, two side edges and a bottom edge,
   wherein the bottom comprises a stepped profile defining a plurality of different heights of the vapor chamber in a second direction perpendicular to the first direction and parallel to the two planar side surfaces of the vapor chamber, and wherein in the first portion of the vapor chamber the stepped profile defines a first height of the plurality of different heights, and in the second portion of the vapor chamber the stepped profile defines a second height plurality of different heights, less than the first height.

4. The system of claim 3, wherein the base defines a slot, wherein the stepped profile defines a first tab of the vapor chamber, and wherein the first tab of the vapor chamber is coupled within the slot of the base.

5. The system of claim 4, wherein the stepped profile further defines a second tab in the first portion of the vapor chamber and an overhanging edge in the second portion of the vapor chamber, wherein the second tab extends further from the top edge of the vapor chamber than the overhanging edge, wherein the first tab extends from the second tab and extends further from the top edge of the vapor chamber than the second tab, and wherein the second tab contacts the base on opposite sides of the slot.

6. The system of claim 5, further comprising:
a first mounting block coupled to the base, extending in the first direction, and contacting a first planar side surface of the two planar side surfaces of the vapor chamber; and
a second mounting block coupled to the base, extending in the first direction, and contacting a second planar side surface of the two planar side surfaces of the vapor chamber.

7. The system of claim 1, further comprising:
a first fan coupled to the two cooling fin assemblies and positioned over the first portion of the vapor chamber; and
a second fan coupled to the two cooling fin assemblies and positioned over the second portion of the vapor chamber.

8. The system of claim 1, further comprising:
a printed circuit board comprising the chip;
wherein the base is coupled to the board with the flat bottom surface contacting a top surface of the chip, and
wherein the overhanging portion is positioned over a portion of the printed circuit board not occupied by the chip.

9. The system of claim 8, wherein the two cooling fin assemblies comprise a plurality of stacked planar fins extending perpendicularly to the two planar side surfaces of the vapor chamber and the flat bottom surface of the base, wherein a first portion of the plurality of stacked planar fins coupled to the first portion of the vapor chamber define a third height in the second direction, and wherein a second portion of the plurality of stacked planar fins coupled to the second portion of the vapor chamber define a fourth height in the second direction, less than the third height.

10. A method of assembling the system of claim 1, comprising:

coupling the vapor chamber to the base so that the two planar side surfaces of the vapor chamber are perpendicular to the flat bottom surface of the base; and
coupling the two cooling fin assemblies to the two planar side surfaces of the vapor chamber.

11. The method of claim 10, wherein coupling the vapor chamber to the base comprises coupling a first portion of the vapor chamber to the base so that the first portion of the vapor chamber extends along the top surface of the base in a first direction, wherein with the first portion coupled to the base, a second portion of the vapor chamber, adjacent to the first portion of the vapor chamber, extends in the first direction past an edge of the base in order to define an overhanging portion, and wherein the two cooling fin assemblies are each coupled to both the first and second portions of the vapor chamber so that portions of the two cooling fin assemblies further define the overhanging portion.

12. The method of claim 11, wherein the second distance is at least 50% of the first distance.

13. The method of claim 11, wherein the vapor chamber defines a top edge, two side edges and a bottom edge, wherein the bottom comprises a stepped profile defining a plurality of different heights of the vapor chamber in a second direction perpendicular to the first direction and parallel to the two planar side surfaces of the vapor chamber, and wherein in the first portion of the vapor chamber the stepped profile defines a first height of the plurality of different heights, and in the second portion of the vapor chamber the stepped profile defines a second height plurality of different heights, less than the first height.

14. The method of claim 13, wherein the base defines a slot, wherein the stepped profile defines a first tab of the vapor chamber, and wherein the method further comprises inserting the first tab of the vapor chamber into the slot of the base.

15. The method of claim 14, further comprising:
coupling a first mounting block to the base, extending in the first direction, and contacting a first planar side surface of the two planar side surfaces of the vapor chamber; and
coupling a second mounting block to the base, extending in the first direction, and contacting a second planar side surface of the two planar side surfaces of the vapor chamber.

16. The method of claim 11, further comprising:
coupling a first fan to the two cooling fin assemblies over the first portion of the vapor chamber; and
coupling a second fan to the two cooling fin assemblies over the second portion of the vapor chamber.

17. The method of claim 11, further comprising:
coupling the base to a printed circuit board comprising the chip;
wherein the base is coupled to the board with the flat bottom surface contacting a top surface of the chip, and
wherein the overhanging portion is positioned over a portion of the printed circuit board not occupied by the chip.

* * * * *